(12) United States Patent
Nishimura et al.

(10) Patent No.: US 9,108,887 B2
(45) Date of Patent: Aug. 18, 2015

(54) METHOD FOR PRODUCING CERAMIC FOR HEAT-RADIATING MEMBERS, CERAMIC FOR HEAT-RADIATING MEMBERS, AND SOLAR CELL MODULE AND LED LIGHT-EMITTING MODULE USING SAID CERAMIC

(75) Inventors: Takeo Nishimura, Tokyo (JP); Nobuyuki Ishida, Tokyo (JP)

(73) Assignee: NISHIMURA PORCELAIN CO., LTD., Kyoto (JP)

( * ) Notice: Subject to any disclaimer, the term of this patent is extended or adjusted under 35 U.S.C. 154(b) by 0 days.

(21) Appl. No.: 13/393,802

(22) PCT Filed: May 30, 2011

(86) PCT No.: PCT/JP2011/062410
§ 371 (c)(1),
(2), (4) Date: Mar. 1, 2012

(87) PCT Pub. No.: WO2011/152363
PCT Pub. Date: Dec. 8, 2011

(65) Prior Publication Data
US 2013/0065067 A1    Mar. 14, 2013

(30) Foreign Application Priority Data

May 31, 2010 (JP) ................................. 2010-125291
Jul. 14, 2010 (JP) ................................. 2010-159697
Oct. 14, 2010 (JP) ................................. 2010-231824

(51) Int. Cl.
*C09K 5/14* (2006.01)
*H01L 33/64* (2010.01)
(Continued)

(52) U.S. Cl.
CPC ......... *C04B 35/62695* (2013.01); *C04B 35/111* (2013.01); *C04B 35/265* (2013.01);
(Continued)

(58) Field of Classification Search
None
See application file for complete search history.

(56) References Cited

U.S. PATENT DOCUMENTS

2003/0008765 A1*   1/2003  Niwa et al. ..................... 501/153
2004/0170347 A1*   9/2004  Ikeda et al. .................... 384/492
(Continued)

FOREIGN PATENT DOCUMENTS

JP    59-213771 A    12/1984
JP    7-237961 A     9/1995
(Continued)

OTHER PUBLICATIONS

International Search Report for PCT/JP2011/062410 dated Nov. 8, 2011.

*Primary Examiner* — David Sample
(74) *Attorney, Agent, or Firm* — Hamre, Schumann, Mueller & Larson, P.C.

(57) ABSTRACT

Provided is a process for producing a ceramic for a heat-radiating member. The process includes providing as a raw material an alumina powder having an alumina ($Al_2O_3$) content of at least 99.5 mass % and an average particle size of from 0.2 to 1 μm, and granulating the powder into a granular form ranging from 50 to 100 μm, pressing the raw material which has been obtained in the granulation step and which includes granular alumina, and heating a green compact in an air atmosphere at a firing temperature of from 1,480 to 1,600° C. to obtain a sintered body. Also provided is a process for producing a ceramic for a heat-radiating member, the ceramic being a sintered alumina body which has high thermal conductivity, efficient heat dissipation, excellent mechanical strength and thermal shock resistance and which is usable for cooling applications at heat generating areas of electronic devices and equipment.

21 Claims, 20 Drawing Sheets

(51) Int. Cl.
*H01L 31/052* (2014.01)
*C04B 35/10* (2006.01)
*B32B 18/00* (2006.01)
*C04B 35/626* (2006.01)
*C04B 35/111* (2006.01)
*C04B 35/26* (2006.01)
*C04B 35/645* (2006.01)
*H01L 23/373* (2006.01)

(52) U.S. Cl.
CPC .......... *C04B35/645* (2013.01); *C04B 35/6455* (2013.01); *H01L 23/3731* (2013.01); *H01L 31/052* (2013.01); *C04B 2235/3201* (2013.01); *C04B 2235/327* (2013.01); *C04B 2235/3267* (2013.01); *C04B 2235/3272* (2013.01); *C04B 2235/3281* (2013.01); *C04B 2235/3418* (2013.01); *C04B 2235/5409* (2013.01); *C04B 2235/5427* (2013.01); *C04B 2235/5445* (2013.01); *C04B 2235/656* (2013.01); *C04B 2235/6562* (2013.01); *C04B 2235/6565* (2013.01); *C04B 2235/6567* (2013.01); *C04B 2235/72* (2013.01); *C04B 2235/77* (2013.01); *C04B 2235/786* (2013.01); *C04B 2235/96* (2013.01); *C04B 2235/9607* (2013.01); *H01L 33/641* (2013.01); *H01L 2924/0002* (2013.01); *Y02E 10/50* (2013.01)

(56) References Cited

U.S. PATENT DOCUMENTS

| | | | |
|---|---|---|---|
| 2005/0152089 A1 | 7/2005 | Matsuda et al. | |
| 2006/0189474 A1 | 8/2006 | Yeckley et al. | |
| 2006/0222035 A1* | 10/2006 | Ohta | 372/57 |
| 2007/0163645 A1* | 7/2007 | Gonda et al. | 136/263 |
| 2007/0259303 A1* | 11/2007 | Tsukuma et al. | 433/10 |
| 2009/0220787 A1* | 9/2009 | Bernard-Granger et al. | 428/402 |

FOREIGN PATENT DOCUMENTS

| | | |
|---|---|---|
| JP | 8-40765 A | 2/1996 |
| JP | 10-101406 | 4/1998 |
| JP | 2000-128625 A | 5/2000 |
| JP | 2001-091059 | 4/2001 |
| JP | 2003-112963 A | 4/2003 |
| JP | 2003-306386 A | 10/2003 |
| JP | 2004-259797 A | 9/2004 |
| JP | 2005-53758 A | 3/2005 |
| JP | 2005-210077 A | 8/2005 |
| JP | 2006-062912 | 3/2006 |
| JP | 2006-298703 A | 11/2006 |
| JP | 2007-31163 A | 2/2007 |
| JP | 2008-537703 A | 9/2008 |
| JP | 2009-147258 A | 7/2009 |
| JP | 2010-55685 A | 3/2010 |
| JP | 2010-83729 A | 4/2010 |
| JP | 2010-225607 A | 10/2010 |

* cited by examiner

METHOD FOR PRODUCING CERAMIC FOR HEAT-RADIATING MEMBERS, CERAMIC FOR HEAT-RADIATING MEMBERS, AND SOLAR CELL MODULE AND LED LIGHT-EMITTING MODULE USING SAID CERAMIC

This application is a U.S. national phase filing under U.S.C. §371 of PCT Application No. PCT/JP2011/062410, filed May 30, 2011, and claims priority under 35 U.S.C. §119 to Japanese patent application nos. 2010-125291; 2010-159697; and 2010-231824, filed May 31, 2010; Jul. 14, 2010 and Oct. 14, 2010 respectively, the entireties of all of which are incorporated by reference herein.

TECHNICAL FIELD

The disclosed subject matter relates to a technology for providing a ceramic for a heat-radiating member, said ceramic being comprised of an alumina-based, sintered body which has a specific crystal structure, has high thermal conductivity and excellent thermal shock resistance and mechanical strength and is practically applicable as an efficient heat-radiating member, and also to products using a high heat-radiating function of the ceramic.

BACKGROUND ART

In recent years, inorganic materials have come under review for their higher stability compared with organic materials. Ceramics led by alumina ($Al_2O_3$) and including steatite, zircon, cordierite and the like have found utility in many fields as functional materials making good use of properties specific to them, and their applications in electronic parts and components, semiconductor fabrication systems, and the like are increasing. For example, alumina is used as a functional material excellent in mechanical strength, electrical insulating properties, high frequency loss, etc. The assignee of this application has already found that among such alumina-based ceramics, a ceramic which is obtainable by conducting firing at from 1,400 to 1,700° C. in an air atmosphere and has a high alumina content of 95 mass % is excellent in thermal conductivity and thermal emissivity, and has already made a proposal about its use for cooling heat generating portion or portions (see Patent Document 1). As the ceramic is a noncombustible product having excellent electrical insulating properties and made of an inorganic material, cooling is feasible in direct contact with the heat generating portion or portions so that its use is expected in fields where cooling effects are desired including electronic devices, equipment and appliances.

Concerning alumina-based sintered bodies (ceramics) as functional materials, various other useful proposals have also been made for diverse applications with attention being focused on their mechanical properties, electrical properties and/or the like (see Patent Documents 2 to 7, etc.)

As those attracting attention in recent years from the viewpoint of environmental protection on a global scale, there are solar power generation devices employing power generation cells that make use of sunlight and luminescent devices with LED devices mounted thereon. From the viewpoints of making improvements in the conversion efficiency of energy or its luminous efficiency and achieving an extension in the service lives of products, it is desired for these devices to effectively cool the heat to be produced upon power generation or light emission (Patent Documents 8 to 10). The above-mentioned technology proposed by the assignee of this application and described in Patent Document 1 will be very useful if it can be applied.

REFERENCE DOCUMENTS

Patent Documents

Patent Document 1: JP-A-2006-298703
Patent Document 2: JP-A-2010-83729
Patent Document 3: JP-A-2005-53758
Patent Document 4: JP-A-2003-112963
Patent Document 5: JP-A-8-40765
Patent Document 6: JP-A-2000-128625
Patent Document 7: JP-A-2003-306386
Patent Document 8: JP-A-2004-259797
Patent Document 9: JP-A-2009-147258
Patent Document 10: JP-A-2010-225607

DISCLOSURE

Problems to Be Solved by the Disclosed Embodiments

The above-described technology of Patent Document 1 as proposed by the assignee of this application discloses sintered alumina bodies excellent in thermal conductivity and thermal emissivity. In recent years, however, the advances of miniaturization, high integration and high functionalization in electronic devices and equipment are remarkable. Therefore, the above-mentioned sintered alumina bodies may not be considered to be sufficient as functional materials capable of stably providing these devices and equipment with still higher functions, and have rooms to be improved. For practical applications, there is, accordingly, an outstanding desire for the development of a ceramic material that can realize more efficient cooling effects, is excellent in strength and the like, is free of a problem in durability, and can stably and surely exhibit cooling effects, and also, the development of a technology that can produce such a material with good yield. Upon production of a sintered alumina body, on the other hand, various conditions are known to give effects on the functionality of the sintered body as will be described below. With the technology of Patent Document 1, it has, therefore, not succeeded yet in stably providing a sintered alumina body that can surely and stably bring about high effects concerning the cooling at heat generating areas of an electronic device or equipment of highly advanced functionality and that can be practically used as a cooling member also excellent in mechanical strength and thermal shock resistance.

Regarding conventional general sintered alumina bodies for use in various electric parts and components, the particle sizes of primary particles of a raw material powder to be used are as large as from 5 to 10 μm, the forming pressure is set to be relatively low, and sintering is conducted at high temperatures of from 1,600 to 1,700° C. to promote bonding between powder particles, and hence, to obtain strong sintered bodies. According to a study by the present inventors, however, firing under such a high-temperature environment leads to abnormal growth of crystal grains and coarsening of crystals in a sintered body and provides the sintered body with reduced mechanical strength and thermal shock resistance, for example, like the sintered alumina body fired at 1,610° C. and shown in FIG. 12. In Patent Document 2 cited above, for this problem, the sizes of crystal grains in a sintered alumina body are increased to from 20 to 70 μm, and at the same time, plate-like crystals are allowed to grow in random directions without orientation, whereby the sintered alumina body is provided with improved strength. However, the coarsening of the crystal grain size has developed a new problem in that it becomes a cause of chipping or breakage upon surface grinding.

With a view to solving such problems or for other purposes, studies have been made to date for the suppression of the grain growth of crystals in a sintered alumina body, and various proposals have been made as will be mentioned below. In Patent Document 3, for example, the following proposal is made to provide a sintered alumina body that can cut material cost and is good in workability upon production while retaining high strength, high thermal conduction characteristics and low dielectric loss which alumina inherently has. Described specifically, in Patent Document 3, an alumina material having an average particle size of from 0.1 to 1.0 µm and a specific amount of a sintering aid are used, and the sintering temperature is set to be low at from 1,150 to 1,350° C., thereby obtaining a sintered alumina body that the average grain size of alumina grains in the sintered alumina body is from 0.5 to 2.0 µm, the thermal conductivity is at least 10 W/m·K, and the grain growth of crystals is suppressed. However, this material is inferior in heat-radiating function, and is by no means usable as a cooling member which is one of the aspects of the disclosed embodiments. In Patent Document 4, it is disclosed that in a sintered alumna body, the dielectric loss is affected by not only the contents of impurities but also the grain size of crystals, but no discussion is made about thermal characteristics such as thermal conductivity and thermal emissivity.

In Patent Document 5, a process is proposed to obtain a high-density, sintered alumina body that can be applied as a member to be placed for a long time at elevated temperatures, is low in the contents of impurities and is provided with high purity, and is densified and is excellent in homogeneity as a whole. However, Patent Document 5 neither provides a sintered alumina body usable as a cooling member, nor suggests to control the crystal grain size. According to Patent Document 6 cited above, it is disclosed that at firing temperatures lower than 1,550° C., the densification of a sintered alumina body does not proceed fully, but at above 1,650° C., abnormal grain growth occurs to induce a decrease in the density of the sintered body. However, the technology described in this document relates to a technology to be used upon obtaining a sintered alumina body by using two kinds of raw materials having different particle sizes and the slip casting method or the like as a forming method, and this technology enables the preparation of a slurry having high purity and low viscosity to control grain growth. The technology described in this document is, therefore, different in both the problem and the process for the production of a sintered alumina body from the disclosed embodiments which is to enable the use of a sintered alumina body as a cooling member. In Patent Document 7 cited above, sintered alumina bodies using a high-purity alumina raw material is disclosed. However, these sintered alumina bodies are ceramic setters useful upon firing parts or the like. Similar to the above-described patent documents, the technology described in this patent document is not intended to provide a sintered alumina body which can be practically used as a cooling member.

The assignee of this application has also proposed a far-infrared radiating coating composition capable of obtaining a coating film, which radiates far-infrared rays when heated with gas, electricity or the like, by coating and baking it on a surface of a substrate (see JP-B-63-54031). However, this technology is to convert heat of gas, electricity or the like into far-infrared rays of a desired wavelength range by providing a specific coating film, and apparently, is not to achieve efficient dissipation of heat (in other words, cooling).

As mentioned above, the advances of miniaturization, high integration and high functionalization in electronic devices and equipment are remarkable in recent years, and accordingly, there is a much-awaited desire for the development of a functional material capable of forming a cooling member that can provide these electronic devices and equipment with still higher functions. Being not limited to electronic devices and equipment, there are also many devices and equipment for which cooling is required for higher efficiency or longer service life. In such instances, miniaturization is often required for the devices and equipment, leading to an outstanding desire for heat-radiating members (heat sinks) each of which makes use of a material having high thermal conductivity and a simpler structure than cooling systems such as air cooling devices or water cooling devices. It is, therefore, desired to develop a member or system of still better heat dissipation performance such that a still smaller and simpler structure can be realized.

For example, solar cells, which make use of power generation cells such as crystalline-silicon power-generating devices and can directly convert light energy into electric power, have been drawing attention in recent years as an electric power source that does not produce carbon dioxide, and are required to realize still higher conversion efficiency into electric power. However, the temperature of a solar cell module which is receiving light may reach 80° C. or higher, and a reduction in the output of each solar cell due to the high temperature has become problematic. For this problem, various cooling systems have been proposed including the water-cooling of a solar cell module (Patent Document 8 cited above). However, water cooling or the like results in a complex system, and involves problems in that its ancillary equipment becomes large, and moreover, requires maintenance after installation. It is, therefore, difficult to put water cooling or the like into practical use. Also for further promoting the wide-spread use of solar cells by increasing the conversion efficiency into electric power, urgent attention is needed to develop a cooling system or heat-radiating member which is of as simple a construction as possible.

As those involving a similar problem as solar cells, there are LED light-emitting modules using light-emitting diode (LED) devices. In recent years, luminescent devices that use light-emitting diode (LED) devices have been rapidly finding wide-spread utility as lighting that features good luminous efficiency and low electric power consumption. LED devices, however, involve a problem in that they are not resistant to heat and deteriorate at 80° C. and higher to result in a shorter service life. With LED devices, the need for heat dissipation is hence higher compared with conventional incandescent lamps or fluorescent lights. LED devices are also accompanied by a potential problem that inadequate heat dissipation may lead to a reduction in luminous efficiency or service life and also to a fire accident due to heat generation. Like the case of solar cell modules, the technology that dissipates heat from LED devices is, therefore, considered to be indispensable for LED light-emitting modules to promote their wide-spread use. Accordingly, the realization of the development of a cooling system or heat-radiating member of a simple construction for cooling these modules can contribute to the reservation of the environment on a global scale, and is important.

Concerning the cooling of LED devices, proposals have been made as will be described below. None of these proposals are, however, considered to be sufficient as practically-applicable technologies. In Patent Document 9 cited above, a stacked structure including a metal plate, an insulator and a metal substrate is adopted as a substrate for mounting LED devices thereon, and one or more through-grooves are formed to provide the resulting luminescent device with excellent dissipation properties for heat from the LED devices. Each through-groove for heat dissipation has a complex structure formed by removing a portion of the insulator, thereby making it difficult to provide the luminescent device with improved productivity.

In Patent Document 10 also cited above, a luminescent device with LED devices arranged on a high-purity alumina substrate is disclosed, and the high-purity alumina substrate is described to have high thermal conductivity and to be excellent in heat dissipation performance. However, the technology of Patent Document 10 is to increase the luminous efficiency of LED devices arranged on a substrate by providing the substrate with an increased light reflectance to light of specific wavelengths, and does not suggest any correlation between the crystalline structure and heat dissipation performance of a sintered alumina body.

Therefore, aspects of the disclosed embodiments are to solve the above-described conventional problems, and to provide a process for producing a ceramic for a heat-radiating member, said ceramic being a sintered alumina body which has high thermal conductivity, enables to achieve efficient heat dissipation, is usable for cooling applications at heat generating areas of electronic devices and equipment, and moreover, is also excellent in mechanical strength and thermal shock resistance, and also a ceramic for a heat-radiating member, said ceramic being a sintered alumina body which is suppressed in the growth of crystal grains and can exhibit the above-described functions. A further aspect of the disclosed embodiments is to provide a ceramic for a heat-radiating member, said ceramic being provided with further improved heat dissipation performance by modifying a surface of the above-described ceramic for the heat-radiating member.

A still further aspect of the disclosed embodiments is to promote the use of the above-described useful ceramic of excellent heat dissipation performance as a heat-radiating member. Described specifically, the still further aspect of the disclosed embodiments is to provide a ceramic for a heat-radiating member, said ceramic being applicable to various applications as a replacement in heat dissipation systems of various electronic devices and equipment and also as a heat-dissipating member capable of solving the problem of heat generation in solar cell modules or LED light-emitting modules for which a simple and effective heat dissipation means is required.

Means for Solving the Problem

The above-described aspects can be achieved by the disclosed embodiments to be described herein after. Described specifically, the disclosed embodiments provide a process for producing a ceramic for a heat-radiating member, characterized by comprising a granulation step of providing as a raw material an alumina powder having an alumina ($Al_2O_3$) content of at least 99.5 mass % and an average particle size of from 0.2 to 1 μm, and granulating the powder into a form of granules ranging from 50 to 100 μm, a forming step of pressing the raw material which has been obtained in the granulation step and comprises granular alumina, and a firing step of heating a green compact, which has been obtained in the forming step, in an air atmosphere to conduct firing at a firing temperature of from 1,480 to 1,600° C. to obtain a sintered body.

As exemplary embodiments of the process according to the disclosed subject matter for the production of the ceramic for the heat-radiating member, the following embodiments can be mentioned.

(1) The process as described above, wherein the firing temperature is from 1,500 to 1,592° C.

(2) The process as described above, wherein the green compact is obtained with a density of at least 2.40 g/cm³ in the forming step.

(3) The process as described above, further comprising, after the firing step, a cooling step of quenching a fired product at a rate of from 1.3 to 2.0 times a heating rate to the firing temperature in the firing step to obtain the sintered body.

(4) The process as described above, wherein the firing in the firing step is conducted in an air-circulating batch furnace.

(5) The process as described above, further comprising a step of forming a coating of a far-red radiation coating composition on at least a part of a surface of the sintered body obtained in the firing step, and baking the coating to form a far-infrared radiation film.

(6) The process as described above, wherein the far-infrared radiation coating composition comprises a heat-resistant inorganic bonding agent and a calcined, fine powder mixture, which has been obtained by mixing at least two kinds of transition element oxides and calcining the resulting mixture at from 700 to 1,300° C., at a mass ratio of from 97:3 to 20:80.

In another aspect of the disclosed embodiments, there is also provided a ceramic for a heat-radiating member, characterized in that the ceramic is a sintered alumina body having an alumina content of at least 99.5 mass % and a silica ($SiO_2$) content of at most 0.1 mass %, having crystal grain sizes of from 1 to 10 μm, containing crystal grains in a range of from 30 to 55 grains in an area of 30×20 μm, and having a thermal conductivity of at least 33 W/m·K.

As exemplary embodiments of the disclosed subject matter, the following embodiments can be mentioned.

(1) The ceramic as described above, wherein the sintered body has a density of at least 3.8 g/cm³.

(2) The ceramic as described above, wherein the alumina content is at least 99.8 mass %, and the silica content is at most 0.05 mass %.

(3) The ceramic as described above, further comprising a far-infrared radiation film on at least a part of a surface.

(4) The ceramic as described above, wherein the far-infrared radiation film has been formed by baking a coating of a far-infrared radiation coating composition comprising a heat-resistant inorganic bonding agent and a calcined, fine powder mixture, which has been obtained by mixing at least two kinds of transition element oxides and calcining the resulting mixture at from 700 to 1,300° C., at a mass ratio of from 97:3 to 20:80.

In further aspects of the disclosed embodiments, there are also provided the below-described solar cell module and LED light-emitting module, each of which makes use of the ceramic according to the disclosed embodiments. Described specifically, there is provided a solar cell module characterized by comprising power generation cells and the above-described ceramic of the disclosed embodiments as arranged on back sides of the power generation cells. There is also provided an LED light-emitting module characterized by comprising a substrate, a circuit formed on a surface of the substrate and LED devices arranged on the circuit, wherein the substrate is any one of the above-described ceramics of the disclosed embodiments.

Advantageous Effects of the Disclosed Embodiments

According to the disclosed embodiments, a process is provided for the production of a novel sintered alumina body.

This process can stably obtain the sintered alumina body especially by precisely controlling its raw materials and the firing temperature to be used. The sintered alumina body is high in thermal conductivity, can achieve efficient and effective dissipation of heat, can be used for cooling application at heat generating areas of electronic devices and equipment, and moreover, is excellent in mechanical strength and thermal shock resistance, and therefore, is useful as a heat-radiating member. The sintered alumina body obtained by the process is a high-purity and dense, sintered alumina body in which different from conventional sintered alumina bodies, no crystal growth has taken place, crystal grain sizes are small and all adequately controlled to be relatively uniform, and moreover, the interfaces of crystal grains are substantially free of segregated impurities. As described above, the sintered alumina body can, therefore, be used as a conventionally-unavailable, excellent functional material.

According to one of the embodiments of the disclosed subject matter, the arrangement of a far-infrared radiation film formed from a far-infrared radiation coating composition on at least a part of a surface of the sintered alumina body, for example, on its heat-dissipating surface makes it possible not only to dissipate heat from heat generating areas but also to radiate heat to the exterior by converting it into far-infrared rays. It is, therefore, possible to provide a ceramic of still better heat dissipation performance for a heat-radiating member.

According to the disclosed embodiments, the below-described advantageous effects can be obtained from the application of the sintered alumina body, which is high in thermal conductivity, can achieve efficient and effective dissipation of heat, and is also excellent in mechanical strength and thermal shock resistance, to a solar cell module or LED light-emitting module. Described specifically, the application of the sintered alumina body provided by the disclosed embodiments makes it possible, with only the member consisting of the extremely simple, sintered alumina body, to suppress a reduction in the output of each power generation cell as caused by an increase in the temperature of the solar cell module and hence, to observe an improvement in the efficiency of power generation, and, with respect to LED devices which are not resistant to heat, to effectively protect the devices from deterioration, to provide the LED devices with a longer service life and to prevent the occurrence of a fire accident. The disclosed embodiments can, therefore, significantly contribute to the practical application of various products that use solar cell modules or LED light-emitting modules useful for the protection of the natural environment.

MODES FOR CARRYING OUT THE DISCLOSED EMBODIMENTS

Figure 1:
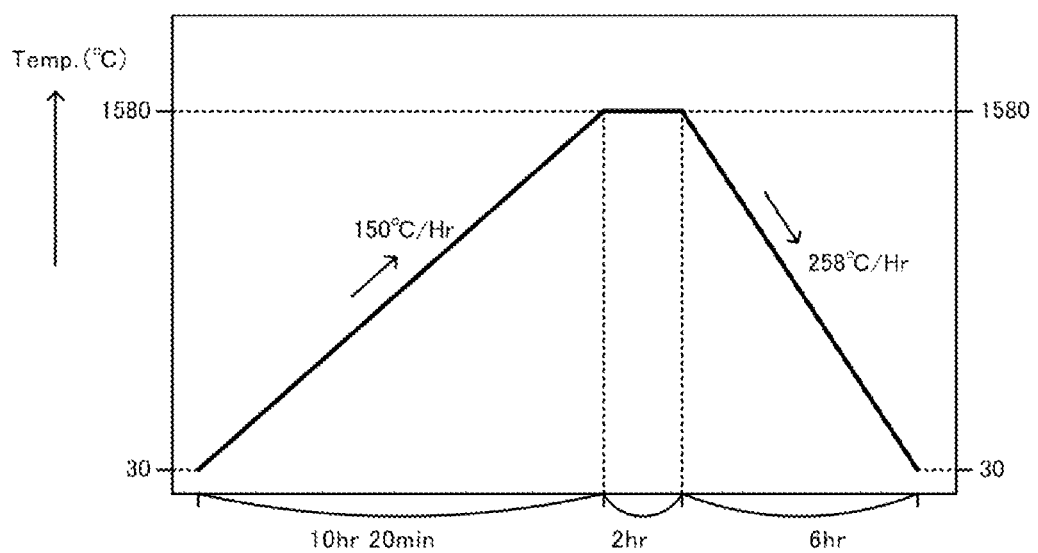
FIG. 1 is a graph for describing an outline of conditions for heating, firing and cooling in the disclosed embodiments.
Figure 2:
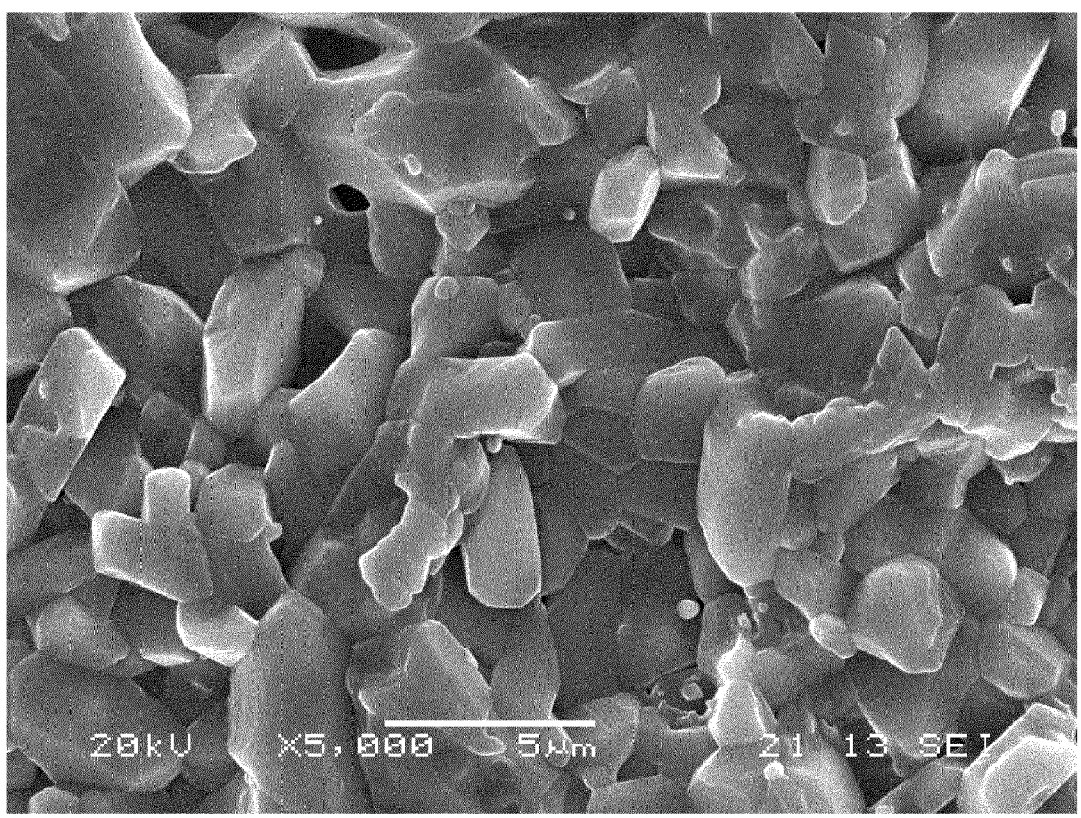
FIG. 2 is an electron micrograph showing a crystal structure of one example of the ceramic (sintered alumina body) according to the disclosed subject matter (Example 1).
Figure 3:
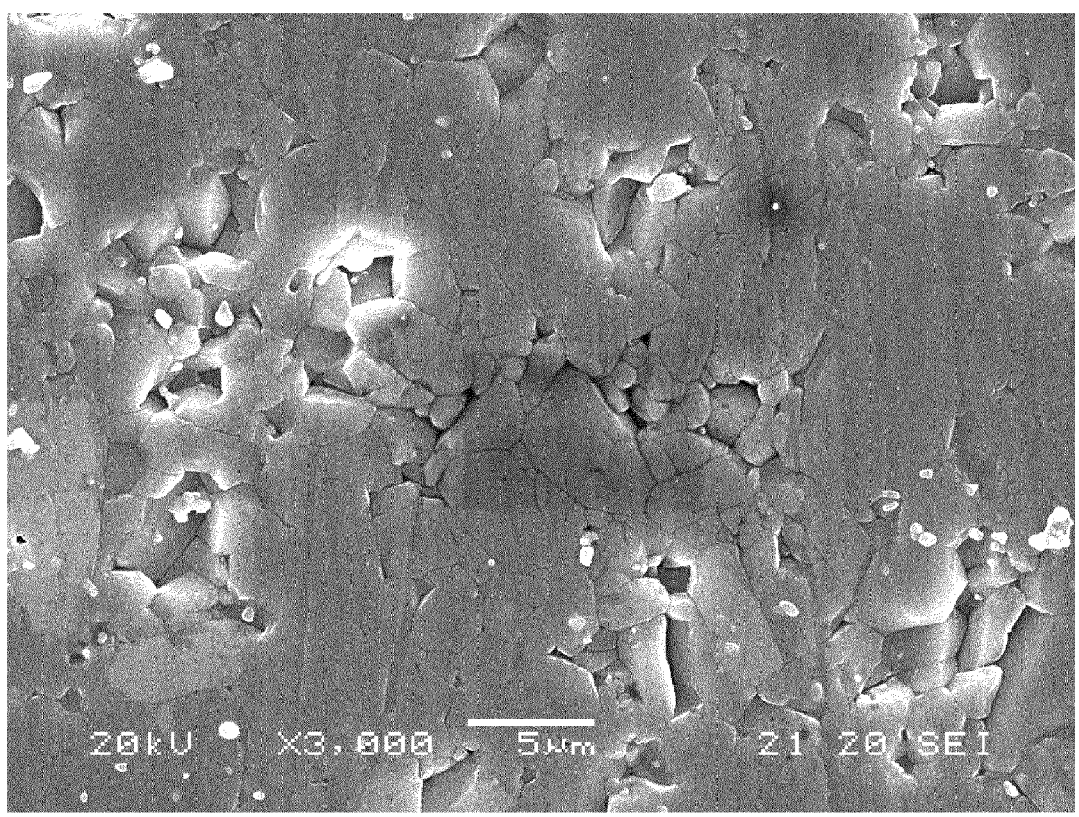
FIG. 3 is an electron micrograph showing a crystal structure of another example of the ceramic (sintered alumina body) according to the disclosed subject matter (Example 2).
Figure 4:
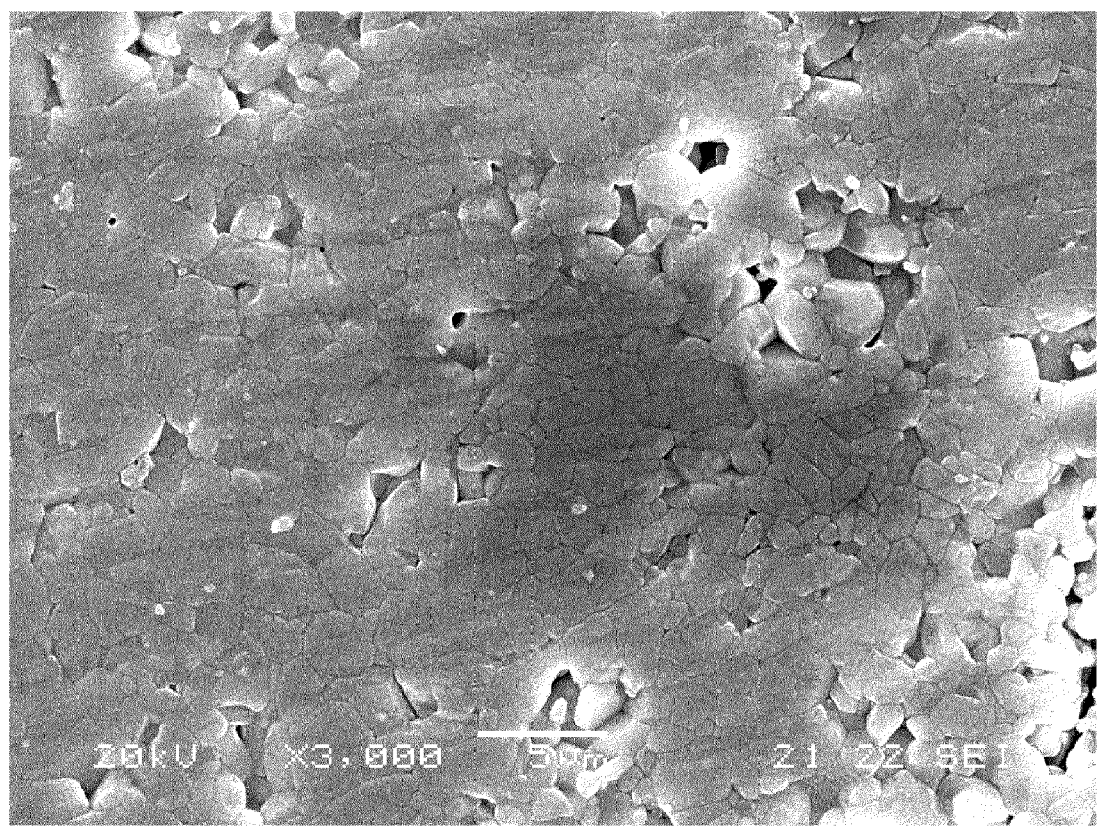
FIG. 4 is an electron micrograph showing a crystal structure of a further example of a ceramic (sintered alumina body) according to the disclosed subject matter (Example 3).
Figure 5:
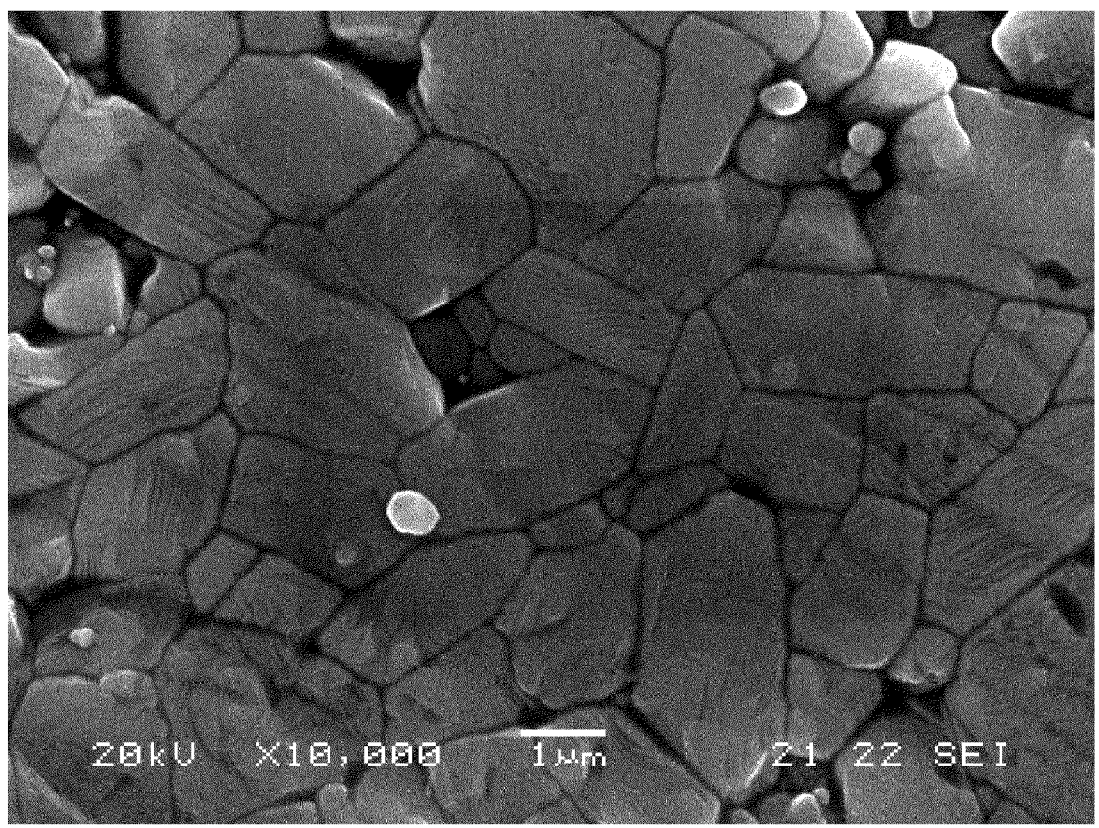
FIG. 5 is a magnified view of a part of the electron micrograph shown in FIG. 4.
Figure 6:
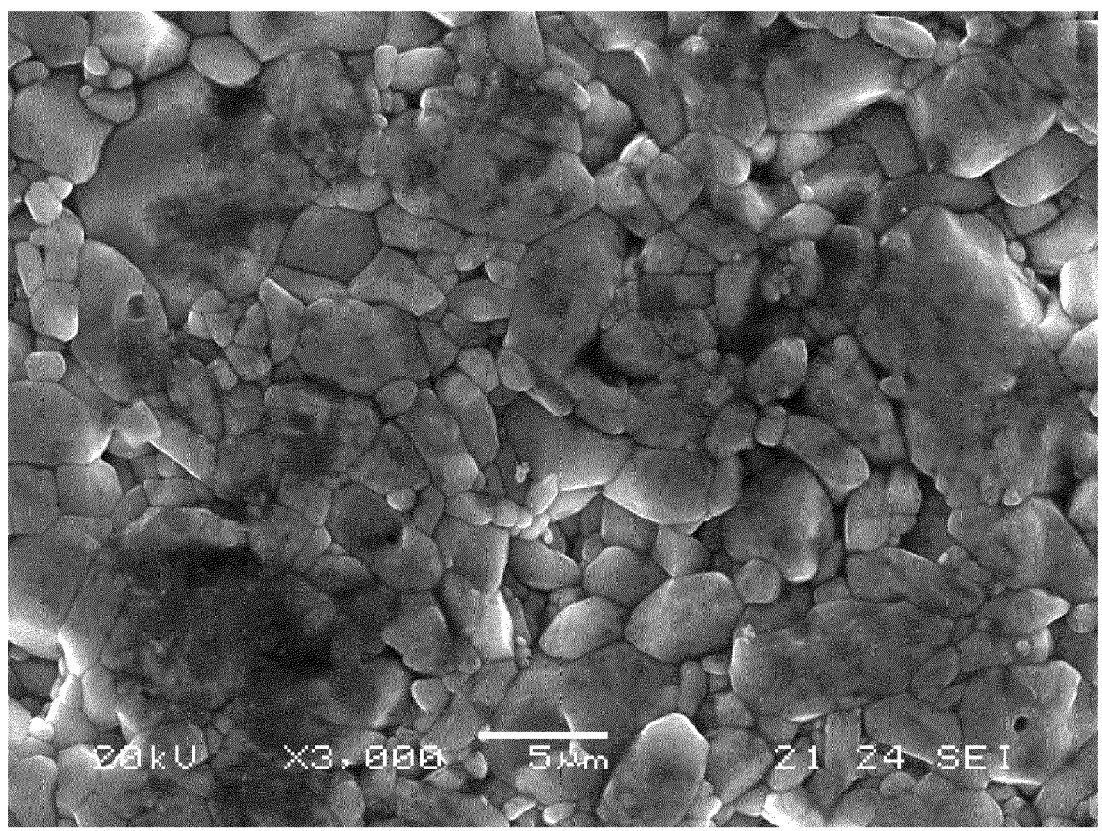
FIG. 6 is an electron micrograph showing a crystal structure of a yet further example of a ceramic (sintered alumina body) according to the disclosed subject matter (Example 4).

The disclosed subject matter will next be described in further detail based on exemplary embodiments.

The process according to the disclosed subject matter for the production of a sintered alumina body includes a granulation step of preparing a specific alumina raw-material powder, a forming step of pressing the raw material which has been obtained in the granulation step and contains granular alumina, and a firing step of heating a green compact, which has been obtained in the forming step, in an air atmosphere to conduct firing at a firing temperature of from 1,480 to 1,600° C. to obtain a sintered body (ceramic). Characteristic features of the disclosed embodiments reside in that a fine-particle powder of high-purity alumina is used as a raw material and the fine particle powder is processed into a granular form, that the granulated raw material is pressed, and that the resulting green compact is fired in a controlled, specific temperature range in an air atmosphere. A description will herein after be made about each of these characteristic features.

(Raw Material and its Granulation Step)
<Raw Material>

The alumina powder as a raw material can be used as it is and no grinding is needed specifically, insofar as its average particle size is from 0.2 to 1 μm. However, the narrower the particle size distribution, the better, as will be described subsequently herein. It is, therefore, possible to use the alumina powder after making its particle size distribution narrower by grinding it in a ball mill or the like. To control the alumina content in the sintered body to 99.5 mass % or higher, a high-purity alumina raw material having an alumina content of 99.5 mass % or higher, preferably 99.9 mass % or higher is used in the disclosed embodiments.

As the alumina raw material, commonly-available, known alumina raw-material powders are all usable. It is possible to use, for example, an α-alumina powder obtained by a process called the Bayer process that calcines gibbsite, an intermediate in a metal-aluminum refining process, at 1,000° C. or higher. As an alternative, it is also possible to use an alumina powder by the sol-gel method as obtained by heating a gel which has been obtained by subjecting a metal alkoxide to hydrolysis and a polycondensation reaction. The alumina powder obtained by the sol-gel method is higher in purity and smaller and more uniform in particle size than the alumina powder obtained by the Bayer process or the like, and moreover, consists of particles having a spherical shape close to a true sphere. The use of an alumina powder, which has a purity of 99.9 mass % or higher and has been obtained, for example, by the sol-gel method, as a raw material, therefore, can obtain a sintered body of still higher alumina purity and can suppress the formation of a glassy phase at grain boundaries in the sintered body, so that the sintered body is provided with excellent thermal conductivity. Further, compared with the use of an alumina powder obtained by the Bayer process, the use of an alumina powder obtained in the form of spherical particles by the sol-gel method can obtain a denser green compact in the below-described forming step so that, as will be described subsequently herein, the alumina is allowed to sinter at a lower firing temperature and a good sintered alumina body can be obtained with a fine and uniform crystal structure.

Making a comparison, for example, between alumina powders of a similar particle size, the use of an alumina powder obtained by the Bayer process makes it difficult to achieve sintering when the firing temperature becomes lower than 1,550° C., while the use of an alumina powder obtained by the sol-gel method makes it possible to fully achieve sintering even at 1,480° C. and permits good sintering in a lower temperature range. As described above, an alumina powder obtained by the sol-gel method has an advantage that the firing temperature can be lowered although the material cost is high. It is to be noted that, which ever raw material is used, the growth of crystal grains is observed at a firing temperature higher than 1,600° C. and the resulting sintered alumina body can hardly exhibit the advantageous effects of the disclosed embodiments.

Further, the use, as a raw material, of an alumina powder of smaller and more uniform particle sizes such as that obtained, for example, by the sol-gel method can provide a sintered alumina body excellent in strength, thermal conductivity and the like as will be mentioned subsequently herein. According to a detailed study by the present inventors, the temperature range in which optimal firing is feasible differs a little depending on the used alumina raw-material powder as described above. Although this difference leads to slight differences in thermal characteristics and the like, a sintered alumina body—which as a heat—radiating member, exhibits useful functions unavailable from the conventional sintered alumina bodies—can be obtained no matter whatever alumina powder obtained by any process or method which is not limited to the above-described process or method is used, insofar as an alumina raw-material powder having an average particle size of from 0.2 to 1 μm and an alumina content of 99.5 mass % or higher is provided and is prepared by the procedure and conditions specified by the disclosed embodiments.

According to the study by the present inventors, the use, as a raw material, of an alumina powder obtained by the sol-gel method makes it possible to fire in a lower temperature range, and moreover, to provide a sintered alumina body excellent in strength and thermal conductivity compared with the use of an alumina powder of similar particle size obtained by the Bayer process. Presumably, the alumina powder obtained by the sol-gel method may be high in purity and small and uniform in particle size and may have a particle shape close to a true sphere. Therefore, the alumina raw-material powder for use in the disclosed embodiments may be one having as high a purity as possible and consisting of smaller and more uniform particles, with one also having a spherical particle shape being possible. In the presently disclosed subject matter, a fine-particle alumina which has an alumina ($Al_2O_3$) content of 99.5 mass % or higher and an average particle size of 1.0 μm or smaller is used as a raw material. Even as an alumina powder by the Bayer process, for example, one having an average particle size as small as 0.3 μm or so is available on the market. In the case of an alumina powder by the sol-gel method or the like, on the other hand, one consisting of still finer particles having an average particle size of from 0.2 to 0.4 μm or so, a sharper particle size distribution and a shape closer to a true sphere is available on the market. Obviously, the raw material for use in the disclosed embodiments is not limited to an alumina powder by the above-described production processor method, but may be an alumina powder by any production process or method insofar as it is such a high-purity and fine-particle alumina as specified by the disclosed embodiments, and as an alternative, an alumina powder available on the market may be ground or purified to the particle size and purity specified by the disclosed embodiments. Further, it is also possible to use an alumina raw-material powder after spherization.

As inevitable impurities are contained in an alumina powder, a sintered body can be obtained without adding a sintering aid to a raw-material powder for use in the disclosed embodiments. Nonetheless, magnesia and/or silica may be added as sintering aids or aid in the raw-material powder for use in the disclosed embodiments to suppress the growth of crystal grains. The addition of such sintering aid or aids makes it possible to stably produce a denser, sintered alumina body. However, these sintering aids segregate at crystal grain boundaries and affect the thermal characteristics, and therefore, should be added as little as possible. The content of alumina and the total content of additives such as sintering aids or aid in the raw-material powder are, therefore, set at 99.5 mass % or higher and at lower than 0.5 mass %, respectively, in the disclosed embodiments. For example, sodium oxide ($Na_2O$) and/or iron oxide ($Fe_2O_3$) may be added as sintering aids or aid insofar as the total content of additives is lower than 0.5 mass %.

<Granulation of Raw-material Powder>

According to the study by the present inventors, the granulation of such an alumina raw-material powder of very small particle size as described above to an appropriate particle size makes it possible to obtain a still denser green compact, and further, to produce a sintered alumina body of a still higher density. No particular limitation is imposed on the granulation method, but granules to be pressed can be readily obtained with granule sizes ranging from 50 to 100 μm, for example, by adding, to the alumina raw-material powder, such an organic binder as will be mentioned subsequently herein to formulate it into a slurry and spraying and drying the slurry. The granules obtained as described above are in the form of spheres. In addition, the granulation is also advantageous from the standpoint of production because it can provide the alumina raw-material powder of fine particles with improved handling properties.

<Forming Step>

Using, as a raw material, the spherical granules obtained as described above and having granule sizes ranging from 50 to 100 μm, an organic binder or the like is next added to impart adequate shape retention properties, and the raw material with the granular alumina contained therein is pressed to form a green compact. Although no particular limitation is imposed on the forming method, it is possible to use such a method that upon application of a pressure to the green compact, the resulting green compact becomes a dense one having a density, for example, as high as 2.40 g/cm³ or higher. Specifically, it is possible to mention, for example, the formation of a green compact by using a mold and applying a pressure of from 1,000 to 2,500 kg/cm² as a forming pressure. If the forming pressure is lower than 1,000 kg/cm² in this case, many interstitial voids remain between the particles in the resulting green compact and its thermal conductivity is poor upon conducting firing subsequently. To obtain a denser sintered body, the firing temperature has to be raised accordingly. As will be mentioned subsequently herein, the firing temperature is extremely important in the disclosed embodiments to impart desired functionality to the sintered body. A firing temperature higher than that specified by the disclosed embodiments induces the growth of crystal grains in the resulting sintered body so that the desired characteristics cannot be obtained. It is, therefore, possible to form a denser green compact in the forming step. A forming pressure higher than 2,500 kg/cm², on the other hand, leads to the occurrence of crazing or breakage on the green compact, and hence, results in a reduced yield. Such an excessively high forming pressure is not preferred accordingly. According to the study by the disclosed embodiments, especially when the forming pressure is from 1,200 to 2,500 kg/cm², a green compact having a density of 2.40 g/cm³ or higher can be obtained, and its subsequent firing can provide a dense sintered alumina body as desired in the disclosed subject matter. Furthermore, the forming pressure may be from 1,500 to 2,000 kg/cm². For example, the use of the above-described alumina powder by the sol-gel method as a raw material makes it possible to readily obtain a dense green compact having a still higher density of 2.45 g/cm³ or higher. In the disclosed embodiments, the density of each green compact was calculated from the weight of the green compact and the volume of the green compact as determined from its measured dimensions.

The forming method of a green compact is not limited to the above-described dry molding method, and another forming method, for example, cold isostatic pressing (CIP), hot pressing (HP), hot isostatic pressing (HIP), extrusion forming, injection forming or the like may be used. Whichever forming method is used, the formation of a green compact the density of which is 2.40 g/cm³ or higher makes it possible to stably obtain, through a subsequent firing step, a sintered alumina body having a dense and specific crystal structure and capable of realizing the desired performance.

As the organic binder for use in the above-described granulation step and forming step, those which have been conventionally used in the production of ceramics are all usable. Specifically, used is an organic compound having such characteristics that it melts and shows an adequate viscosity when heated and does no longer remain after heated and fired into a fired product. Such organic compounds include polyvinyl alcohol, polyesters and cellulose derivatives having many oxygen atoms in molecules, and further, acrylic resins, polyethylene oxide, polypropylene oxide and a polyether obtained by copolymerizing a desired amount of ethylene oxide with propylene oxide, all of which have an appropriate polymerization degree. In addition, water-soluble cellulose ethers as cellulose derivatives, notably methyl cellulose can also be used. Acrylic resins and polyvinyl alcohol have conventionally been used as binders upon extrusion forming of fine ceramic products, and can each be suitably used as an organic binder upon granulating a raw-material powder for use in the disclosed embodiments or upon imparting shape retention properties to the granulated raw material.

(Debinding and Drying Step)

In the production process of the disclosed embodiments, the green compact obtained as described above may be heated, for example, to 500° C. over about 100 hours at a constant heating rate (about 5° C./hr) under air in a debinding furnace to eliminate such an organic binder as described above and the like from the green compact. By gradually raising the temperature over a long time as described above, the organic components contained in the green compact can be eliminated completely, and moreover, without occurrence of fractures or crazes in the green compact.

(Firing Step)

In the production process of the disclosed embodiments, the green compact obtained in the above-described forming step is heated in an air atmosphere to fire it at a firing temperature of from 1,480 to 1,600° C., preferably from 1,500 to 1,592° C., more preferably from 1,550 to 1,592° C., whereby a sintered alumina body of such excellent heat radiation performance as desired in the disclosed embodiments is obtained. As will be mentioned below, the preferred firing temperature differs a little depending on the particle size and particle shape of the alumina raw-material powder to be used. When an alumina raw-material powder which has a relatively large average particle size of 1.0 µm or so and is not considered to be in a truly-spherical form is used, it is desired to conduct firing at a firing temperature of preferably 1,550° C. or higher, more preferably 1,555° C. or higher in order to stably obtain a dense sintered alumina body as desired. According to a detailed study by the present inventors, it is possible to set the firing temperature at 1,592° C. or lower in order to obtain the desired dense sintered alumina body more stably in the above case. When an alumina powder which, like an alumina powder by the sol-gel method, has a smaller and more uniform average particle size and has a shape close to a truly-spherical shape is used as a raw material, on the other hand, the green compact to be obtained in the forming step can be made denser as described above so that even at a low temperature of 1,500° C. or lower, a dense sintered alumina body can be obtained as desired. Although a dense sintered alumina body can be obtained as desired when the firing temperature is 1,600° C. or lower, a lower firing temperature tends to provide the resulting sintered body with a smaller crystal grain size and better thermal characteristics and strength, and from the viewpoint of energy efficiency, the firing temperature should be as low as possible. As a lower firing temperature results in a longer firing time, the firing temperature may be set preferably at 1,500° C. or higher, more preferably at 1,550° C. or higher when such an alumina raw-material powder as described above is used. From the foregoing, the suitable firing temperature range in which a dense sintered alumina body can be stably obtained as desired irrespective of the properties of the alumina raw-material powder can be from 1,500 to 1,592° C., with from 1,550 to 1,592° C. being more preferred.

The firing time at the above-described firing temperature may be limited to 2 hours or shorter. A firing time longer than 2 hours has a potential problem that crystal grains may grow, and therefore, is not preferred. In the disclosed embodiments, the firing in the firing step may be conducted in an air-circulating batch furnace. It is also possible to include, after the firing step, a cooling step such that the fired product is quenched at a rate of from 1.3 to 2.0 times the heating rate to the firing temperature to obtain a sintered body. Therefore, what is important in the disclosed embodiments is to obtain a desired crystal structure by controlling the firing temperature to an extremely narrow temperature range, which is relatively low as the firing temperature and may range suitably from 1,480 to 1,600° C., more suitably from 1,500 to 1,592° C., still more preferably from 1,550 to 1,592° C. After the firing, quenching may be conducted to suppress the growth of crystal grains. The specific heating rate, the cooling rate and the holding time at the firing temperature differ depending on the size and thickness of the green compact, and cannot be specified collectively. It is, however, possible to set the cooling rate (temperature lowering rate) from the above-described firing temperature approximately 1.5 times as fast as the heating rate to the firing temperature.

In FIG. 1, illustrative heating, firing and cooling conditions in a firing step and its subsequent cooling step are schematically shown. For example, a green compact with alumina contained at 99.5 mass % or higher therein is subject to firing in an air atmosphere by setting the heating rate preferably at from 100 to 200° C./hr, more preferably at from 140 to 160° C./hr and also setting the temperature lowering rate preferably at from 200 to 300° C./hr, more preferably at from 240 to 270° C./hr. On the other hand, the holding time at the firing temperature is set for 2 hours or shorter, specifically for 1 hour to 2 hours. A holding time shorter than 1 hour has a potential problem that sintering may not proceed sufficiently, while a holding time longer than 2 hours involves a potential problem that the growth of crystal grains may occur. An exemplary holding time is 2 hours. In the disclosed embodiments, the use of a firing temperature in the low and specific narrow range and preferably, the adequate control of the heating rate and temperature lowering rate make it possible to shorten the time during which the sintered body is exposed to high temperatures, whereby the growth of crystal grains in the sintered body can be suppressed. As a consequence, it is possible to product a high-purity and dense, sintered alumina body with crystal grain sizes thereof being adequately controlled. On the sintered alumina body so obtained, substantially no segregation of impurities is observed at the interfaces of crystal grains owing to the extremely high purity of the raw material, and in addition, the temperature control specified by the disclosed embodiments. As a consequence, high thermal conductivity is obtained. The sintered alumina body is, therefore, believed to have been obtained as a material that can realize the achievement of highly-efficient heat dissipation performance (heat radiation performance) attributable to the high thermal conductivity. Presumably owing to the suppressed growth of crystal grains in the sintered body and the adequately-controlled crystal grain size, the sintered body has been provided with excellent thermal conductivity, excellent mechanical strength, high thermal shock resistance, and durability high enough to withstand practical applications. Depending on the firing temperature even in the particular range specified by the disclosed embodiments, the crystal structure and also the performance of the resulting sintered body differ. About this matter, a detailed description will be made based on examples.

Similar to conventional production processes of ceramics, it is also possible to conduct debinding and drying of the green compact before the firing step in the production process of the disclosed embodiments. The debinding and drying of the green compact may be separately conducted prior to the firing step as mentioned above. Not limited to the foregoing, the debinding and drying step and the subsequent firing step may, however, be conducted in the same furnace. In this case, after the resulting green compact is slowly heated to 500° C. over 100 hours or so in a batch furnace while circulating air through the batch furnace, firing is conducted from 500° C. at the above-mentioned heating rate, firing temperature and cooling temperature. By continuously heating the green compact in the same furnace as described above, the process can be simplified.

After debinding as mentioned above, the green compact can be once taken out and can then be fired again in the same furnace or in a different furnace. In this case, the green compact can be heated and fired at the above-mentioned heating rate from room temperature, and to about 1,000° C., a still faster heating rate can be used to such an extent that crazing or the like would not occur on the green compact. It is, therefore, possible to separately use a debinding and drying furnace and a firing furnace and to more efficiently fire a large number of ceramics for heat-radiating members.

In each example of the disclosed embodiments to be described subsequently herein, the firing in the firing step was conducted in an air-circulating batch furnace. The furnace employed in each example of the disclosed embodiments directly controls the furnace temperature by relying upon the flow rate of air heated with a gas such as propane gas. Therefore, the temperature control is easy so that the heating rate, firing temperature and temperature lowering rate can be controlled in appropriate ranges, respectively. However, the furnace to be used for firing in the disclosed embodiments is not limited to the above-described furnace, and any furnace may be used insofar as it enables to fire in an air atmosphere while controlling the firing temperature.

(Ceramic for Heat-radiating Member)

A description will next be made about the ceramic of the disclosed embodiments, which can be obtained by such a production process as described above and consists of a high-purity and dense, sintered body (which may herein after be called simply "the sintered alumina body according to the disclosed embodiments"). The ceramic of the disclosed embodiments is characterized in that it is a sintered alumina body having an alumina content of 99.5 mass % or higher, preferably 99.8 mass % or higher, more preferably 99.9 mass % or higher and a silica ($SiO_2$) content of 0.1 mass % or lower, preferably 0.05 mass % or lower, its crystal grains have grain sizes of from 1 to 10 μm, crystal grains are contained in a range of from 30 to 55 grains in an area of 30×20 μm, and its thermal conductivity is 33 W/m·K or higher. The sintered alumina body according to the disclosed embodiments has an extremely high purity and contains silica in a small amount, and the grain sizes of its crystal grains have been adequately controlled. Therefore, the sintered alumina body according to the disclosed embodiments is high in thermal conductivity, can achieve efficient heat dissipation performance, and moreover, is efficient in mechanical strength and high in thermal shock resistance. Although the sintered alumina body according to the disclosed embodiments is a high-purity and dense, sintered body, the density of the sintered alumina body may be preferably 3.8 g/cm³ or higher, more preferably 3.93 g/cm³ or higher, still more preferably 3.96 g/cm³ or higher, and is an extremely dense, sintered body close to the theoretical density of alumina, i.e., 3.987 g/cm³.

The sintered alumina body is a high-purity, sintered body containing alumina at 99.5 mass % or higher. When an alumina powder of still higher purity is used as a raw material, a sintered body having a still higher purity of 99.9 mass % or higher can be obtained. The balance is composed of magnesia (0.07 to 0.15 mass %), silica (0.03 to 0.35 mass %), $Na_2O$ (0.03 to 0.05 mass %), and $Fe_2O_3$ (0.01 to 0.02 mass %), all of which have been derived from the sintering aid or aids, but these impurities may account preferably for less than 0.5 mass % in total, more preferably for less than 0.1 mass % in total.

The crystal grain sizes of the sintered alumina body according to the disclosed embodiments may be preferably in a range of from 1 to 10 μm, more preferably in a range of from 1 to 5 μm. The average of the crystal grain sizes may be preferably from 2 to 7 μm, more preferably from 2 to 4 μm. A sintered body, in which crystal grain sizes are greater than 10 μm and grain growth is observed, tends to be low in strength and also to be low in thermal conductivity, and as a heat-radiating member, is inferior in effects. Therefore, as the crystal structure of a sintered alumina body that can achieve one of the aspects of the disclosed embodiments, it is required that its crystal grain sizes are small, and further, that its crystal grains are uniform in size and are densely sintered as will be described below. It is to be noted that the grain sizes of crystals in a sintered body are those determined by a measurement method to be described subsequently herein. Crystal grains are required not only to have small grain sizes of from 1 to 10 μm as described above, but also to be contained as many as from 30 to 55 grains in an area of 30×20 μm on a surface of the sintered alumina body. It is, therefore, required that crystal grains of a uniform size are densely sintered (see FIGS. 2 through 8).

Figure 7:
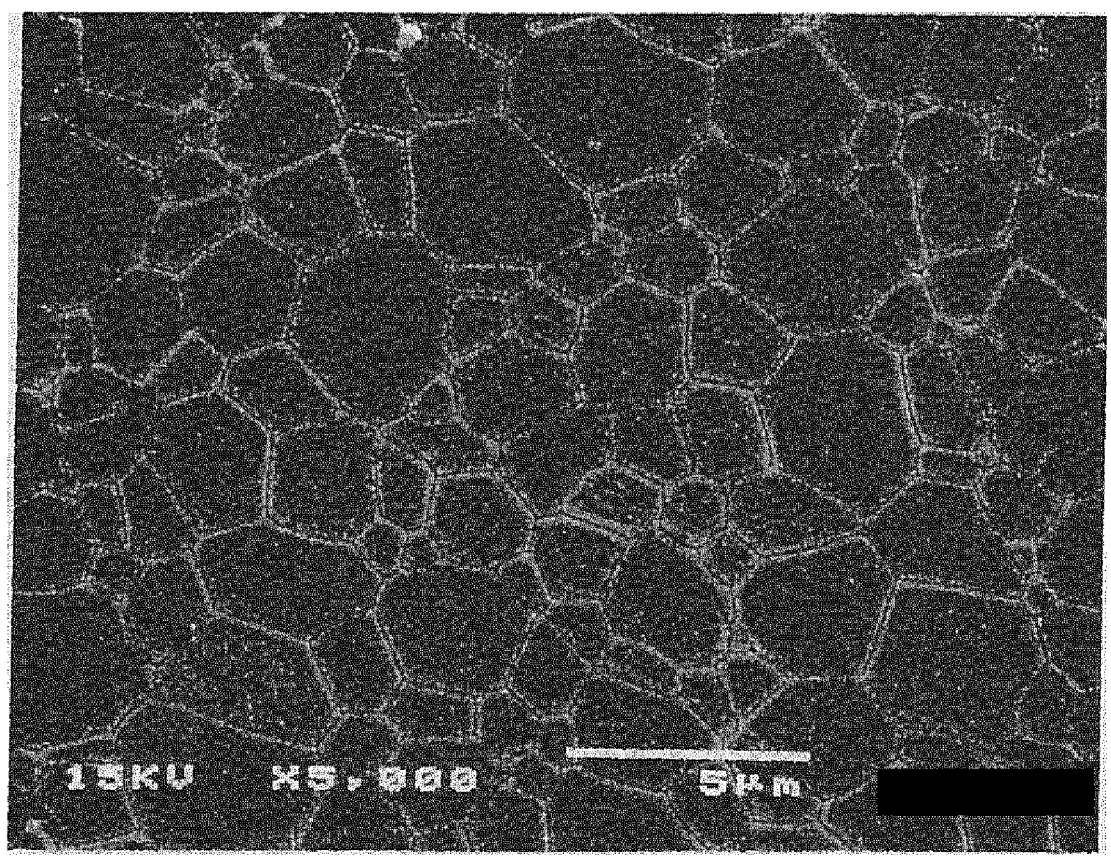
FIG. 7 is an electron micrograph showing a crystal structure of an even yet further example of a ceramic (sintered alumina body) according to the disclosed subject matter (Example 7).
Figure 8:
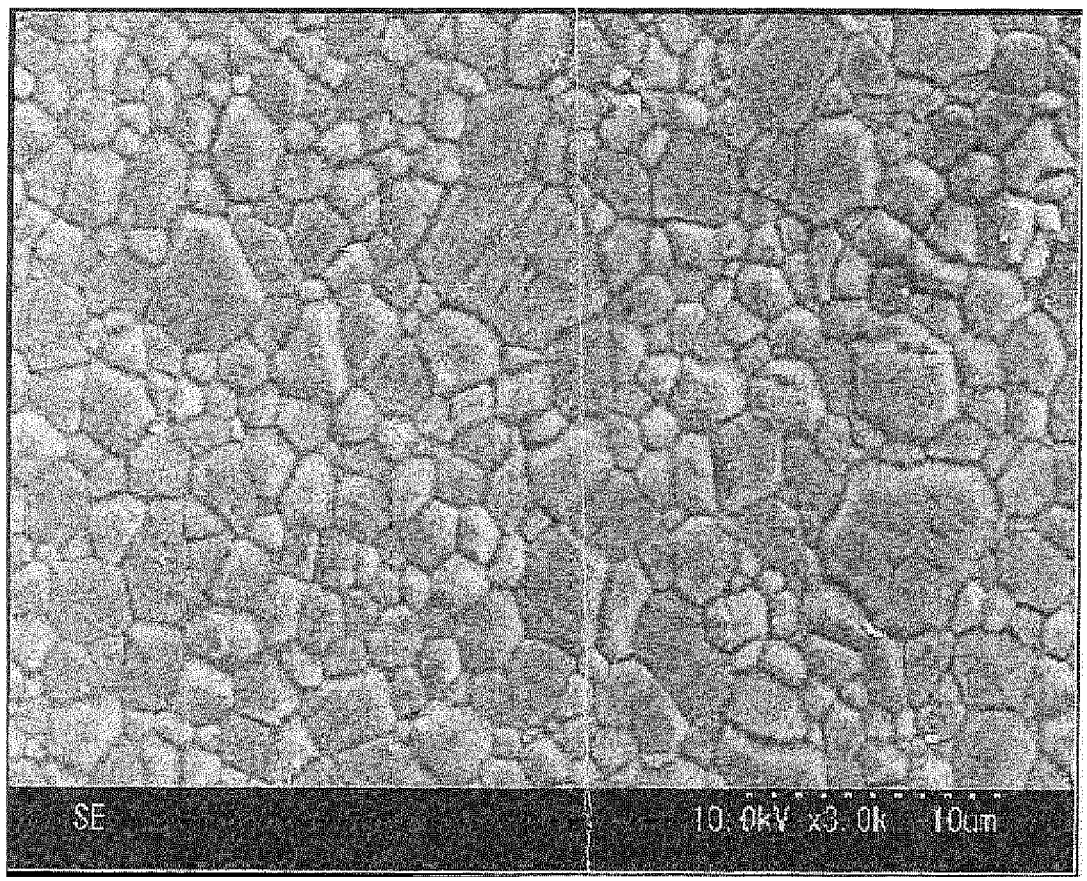
FIG. 8 is an electron micrograph showing a crystal structure of a still even yet further example of a ceramic (sintered alumina body) according to the disclosed subject matter (Example 8).
Figure 9:
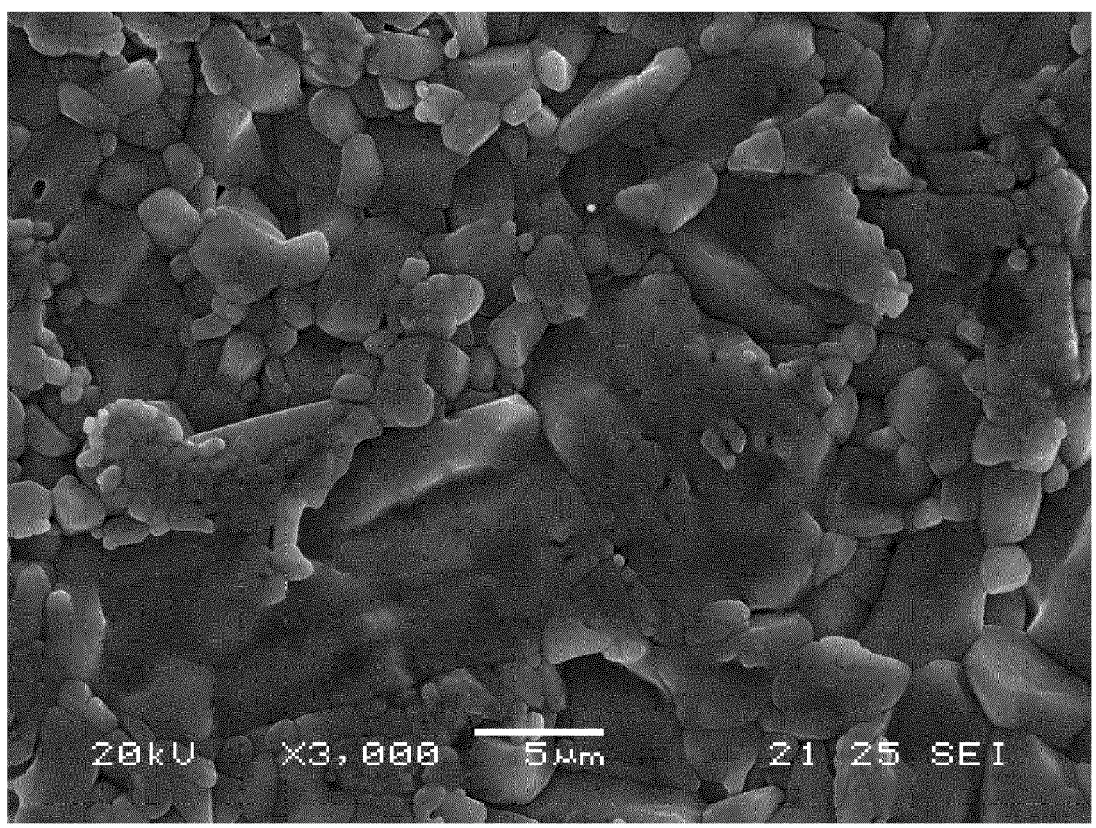
FIG. 9 is an electron micrograph showing a crystal structure of the ceramic (sintered alumina body) of Comparative Example 1 for a heat-radiating member.
Figure 10:
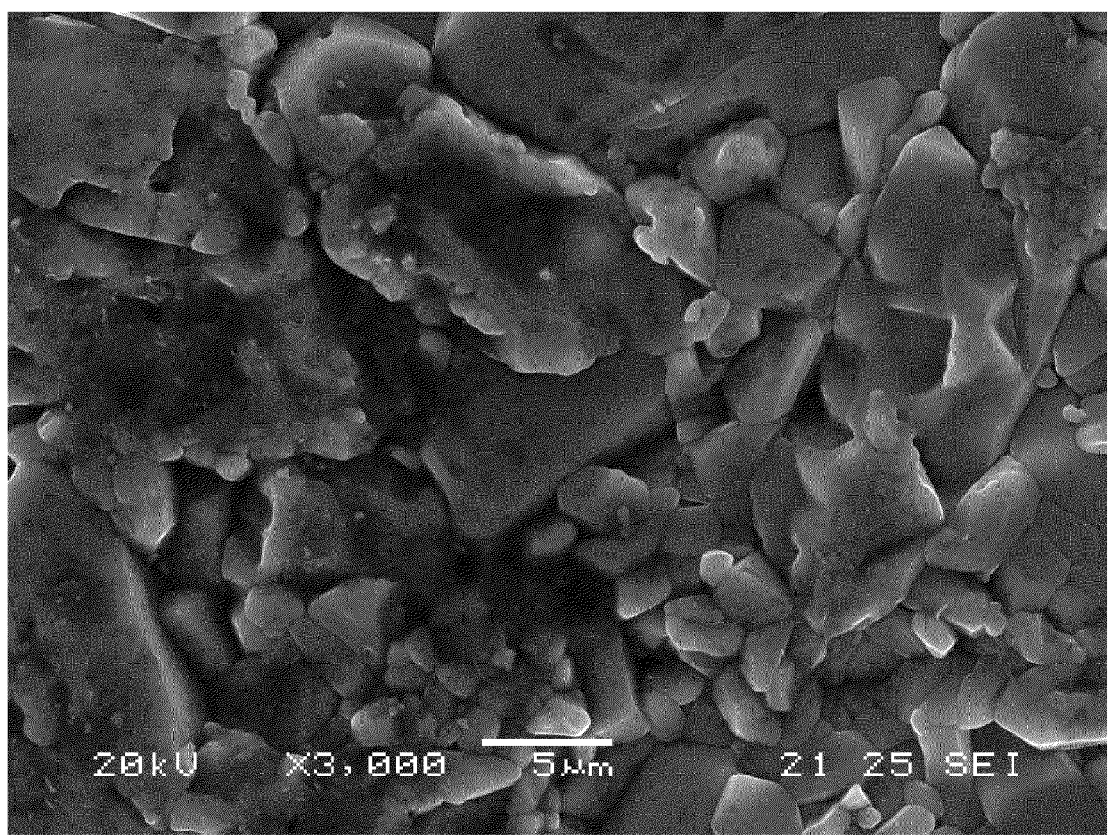
FIG. 10 is an electron micrograph showing a crystal structure of the ceramic (sintered alumina body) of Comparative Example 2 for a heat-radiating member.
Figure 11:
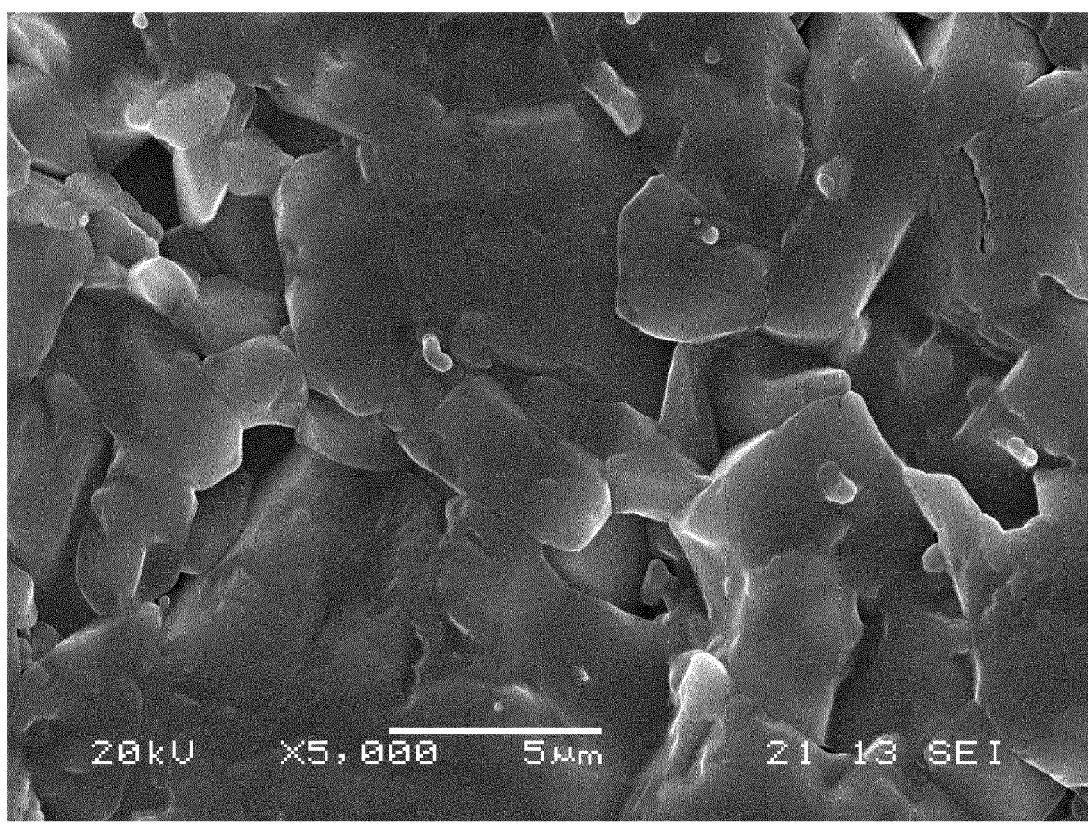
FIG. 11 is an electron micrograph showing a crystal structure of the ceramic (sintered alumina body) of Comparative Example 3 for a heat-radiating member.
Figure 12:
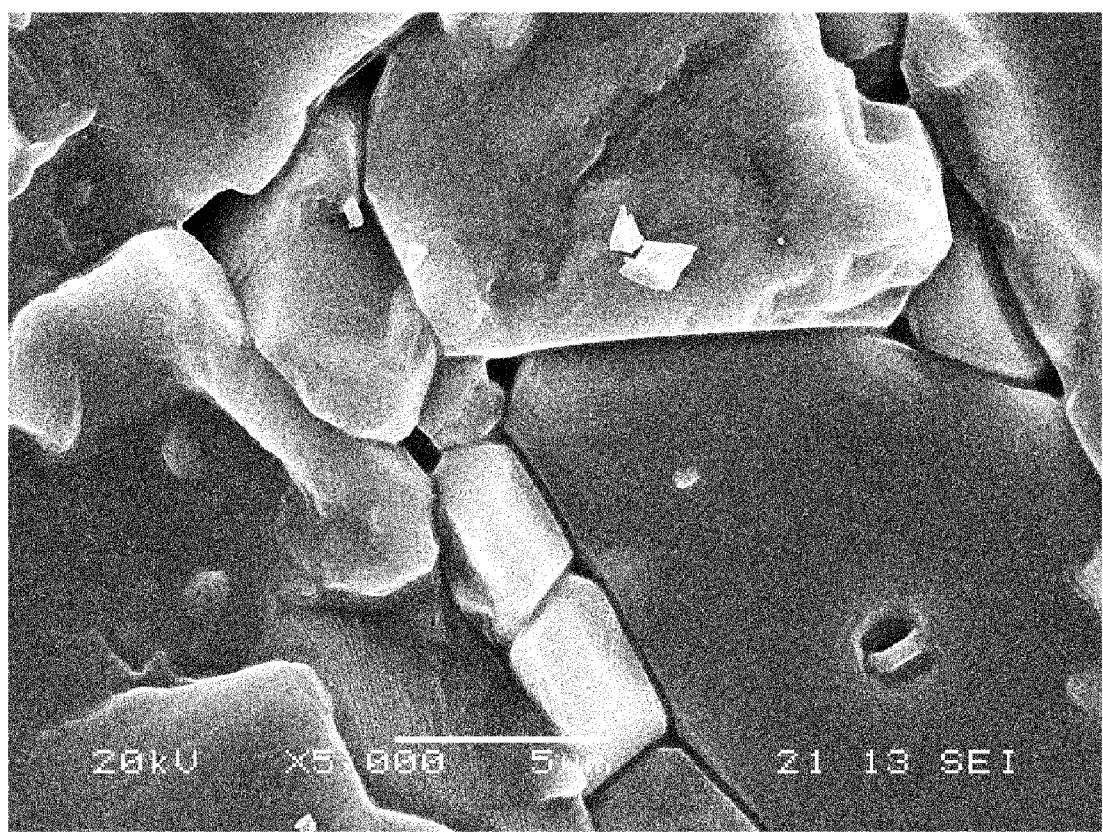
FIG. 12 is an electron micrograph showing a crystal structure of one example of conventional sintered alumina bodies.

When an alumina powder—which has been obtained, for example, by the sol-gel method or the like, is small and more uniform in particle size, and has a spherical particle shape close to a substantially true sphere—is used as a raw material, the raw-material powder is considered to be small in particle size variations and to be most closely packed as described above, thereby making it possible to provide a more uniform and dense, sintered alumina body the crystal grains of which have smaller grain sizes of from 1 to 5 μm and also have an average grain size of from 2 to 4 μm (see FIGS. 7 and 8).

As mentioned above, the sintered alumina body according to the disclosed embodiments is extremely dense, and in an example, the density is 3.93 g/cm³ or higher and is close to the theoretical density of 3.987 g/cm³ of alumina. Moreover, the use of, for example, an alumina powder having a still smaller and uniform particle size and a particle shape close to a true sphere can provide a still denser, sintered alumina body having a density of 3.96 g/cm³ or higher, for example, 3.98 g/cm³. It is to be noted that the sintered alumina body according to the disclosed embodiments tends to have a higher density as the content of alumina increases. The density of a sintered body the alumina content of which is, for example, 99.9 mass % is 3.98 g/cm³, and therefore, is very close to the theoretical density. This means that, by measuring the density of a sintered alumina body the alumina content of which is known, the grain sizes of its crystal grains can be estimated. The sizes of the crystal grains in the sintered alumina body have been calculated from its density to range from 1 to 10 μm. It is, therefore, appreciated that the sintered alumina body is a sintered body formed of crystal grains of the same size not only at the surface or cross-section, where the crystal grains were observed for their sizes, but also inside the sintered body.

The sintered alumina body according to the disclosed embodiments can be provided with a thermal conductivity as high as 33 (W/m·K) or higher, or even 36 (W/m·k) or higher, although the thermal conductivity differs depending on the alumina raw-material powder to be used, the sintering aid or aids to be added, and the firing temperature. A sintered alumina body produced by using an alumina raw-material powder, which has a smaller and more uniform particle size and has a shape close to a true sphere as described above, can be provided with a still higher thermal conductivity, for example, a thermal conductivity of 41 (W/m·K) or higher. The above-described, sintered alumina body according to the disclosed embodiments has a thermal emissivity of 0.97 or higher, and is higher in thermal emissivity than conventional sintered alumina bodies. When arranged at heat-generating areas of an electronic device or equipment, outstanding heat dissipation performance is observed. It has, therefore, been confirmed that the sintered alumina body can effectively function as a heat-dissipating part in an electronic device or equipment. This means that the sintered alumina body according to the disclosed embodiments can replace a cooling fan, a cooling part (heat sink) of a complex structure or shape, or the like, which has conventionally been essential for an electronic device or equipment, by an extremely simple application that one having a simple shape such as a planar shape is simply arranged in such a state as being kept in contact with heat-generating areas. The sintered alumina body according to the disclosed embodiments is, therefore, extremely effective. Owing to the high thermal conductivity, the sintered alumina body according to the disclosed embodiments can quickly absorb heat from an object which is in contact with the sintered alumina body, and can dissipate the heat at the high thermal emissivity. As a consequence, the sintered alumina body according to the disclosed embodiments is believed to be able to exhibit excellent cooling effects and to effectively function as a heat sink in an electronic device or equipment.

When providing the sintered alumina body according to the disclosed embodiments for use as a heat-radiating member, it is effective to enlarge its area of contact with an object such as an electronic device or equipment, for which dissipation of heat is required, such that its heat-irradiating effects can be enhanced. In this respect too, the ceramic of the disclosed embodiments is advantageous. As mentioned above, the ceramic of the disclosed embodiments is small and uniform in crystal grain size and is dense. Therefore, the sintered body is high in surface smoothness and, when brought into contact with heat-generating areas, can be provided with a large area of contact with the heat-generating areas. Even when its surface is not ground, it can hence be used as a ceramic for a heat-radiating member, and therefore, is superb in productivity. Further, still higher heat-dissipating effects can be materialized by grinding its surface into a smooth surface such that its close contact with heat-generation areas can be enhanced. Because the sintered alumina body according to the disclosed embodiments is small and uniform in crystal grain size and is dense as mentioned above, breakage or crazing hardly occurs upon surface grinding so that mirror finishing is feasible to high smoothness. In this respect too, the sintered alumina body according to the disclosed embodiments is considered to be high in practical utility. When bringing the ceramic according to the disclosed embodiments into contact with heat-generating areas, it is obviously possible to bring it into direct contact without interposing another layer such as a bonding layer because such an additional layer leads to a reduction in thermal conductivity.

To allow the ceramic according to the disclosed embodiments, which has a high thermal conductivity and exhibits a high thermal emissivity as described above, to effectively function, it is possible to form the ceramic into a shape that conforms as much as possible to the shape of heat-generating areas of an object from which dissipation of heat is needed, and hence, to form the ceramic in a shape that can enhance the close contact with the heat-generating areas. The formation in a simple shape such as, for example, a planar or prismatic shape or a disc or circular cylinder shape facilitates the pressing. Moreover, the surface grinding can be also conducted with ease so that, by making smooth the contact surface with the heat-generating areas, the close contact with the heat-generating areas can be enhanced further. The sintered alumina body according to the disclosed embodiments can be obtained by firing the green compact, and therefore, is excellent in processability and can be easily formed in an optimal shape conforming to the shape of an electronic device or equipment, which requires dissipation of heat, or the shape of its heat-generating areas. Therefore, the sintered alumina body according to the disclosed embodiments is also advantageous in this respect.

The sintered alumina body according to the disclosed embodiments has a flexural strength in a range of from 380 to 500 (MPa), and therefore, is excellent in mechanical strength. Further, a sintered alumina body obtained by using such an alumina raw-material powder as described above, said raw-material powder being smaller and more uniform in particle size and having a shape close to a true sphere, has a flexural strength of from 400 to 520 (MPa) or so, and hence, exhibits still higher mechanical strength. Furthermore, the sintered alumina body according to the disclosed embodiments has a thermal shock resistance of from 300 to 320 (° C.), and is also strong against a thermal shock by quenching. As readily understood from the foregoing, the sintered alumina body according to the disclosed embodiments has sufficient mechanical strength, is excellent in durability, and can fully withstand practical applications. Moreover, the sintered alumina body according to the disclosed embodiments has an insulation resistance higher than $10^{16}$ ($\Omega$·cm), and therefore, is also excellent in electrical characteristics.

Because the sintered alumina body according to the disclosed embodiments is by itself high in thermal conductivity and thermal emissivity as mentioned above, it can effectively function as a heat-radiating member (heat sink) when it is brought into contact, as it is, with heat-generating areas or heat-generating elements of an electronic device or equipment. According to the study by the present inventors, the sintered alumina body according to the disclosed embodiments is, for example, large in 80° C. saturation energy considered to be an index of heat dissipation performance as will be described subsequently herein, can dissipate to the exterior a large quantity of heat transferred from each heating element, and can maintain the heating element itself at a constant temperature of 80° C. The sintered alumina body according to the disclosed embodiments exhibits excellent heat dissipation performance as described above, and moreover, is an insulator. As its application, it is, therefore, extremely useful as a heat-radiating member that can be maintained in direct contact with, for example, power generation cells in a solar cell module or LED devices in an LED light-emitting module, the temperature of which is required not to exceed 80° C.

Many of conventional heat-radiating members (heat sinks) applied to these use employ, as a material, a metal having a high thermal conductivity such as copper or aluminum, and are often formed in complex shapes to increase their surface areas, for example, by forming them in bellows shapes or providing them with a number of asperities. If the heat dissipation performance is still insufficient, a fan may be arranged to forcedly circulate air. Such conventional heat-radiating members (heat sinks) are, therefore, complex in construction or system. In the sintered alumina body according to the disclosed embodiments, on the other hand, the sintered body itself is excellent in heat dissipation performance. Accordingly, the sintered alumina body according to the disclosed embodiments requires neither a complex construction nor a complex system unlike the conventional ones, and can sufficiently exhibit its cooling effects even when it is in a simple shape such as a planar shape or disk shape or in a shape obtained by providing such a simple shape with a thickness (a prismatic shape or circular cylinder shape). As the 80° C. saturation energy depends on the surface area and thickness of a planar, sintered alumina body as will be described subsequently herein, it is effective to dissipate more heat by increasing the area of the sintered body to make greater an area of contact with heat-generating portions or increasing the thickness of the sintered body to such an extent that an electronic device or equipment would not be affected. As the heat-irradiating member provided by the disclosed embodiments is to be maintained in contact with the heat-generating portions to dissipate heat, it is possible to grind the surface of the sintered alumina body such that the close contact with the heat-generating portions can be enhanced to make the area of contact greater.

The present inventors conducted a detailed study about the applicability of the sintered alumina body of the disclosed embodiments which can become the above-described useful functional material. According to the study by the present inventors, the sintered alumina body of the disclosed embodiments is effective as a heat-radiating member for a solar cell module, and can improve the efficiency of its power generation. For example, it has been found that, by simply converting a solar cell module into a structure that the sintered alumina body according to the disclosed embodiments is arranged on the back side of power generation cells of the solar module and are maintained in contact with the power generation cells, the power generating capability of the solar cell module can be increased by 26% at the maximum compared with that of the solar cell module without the sintered alumina body (the use of a conventional glass plate). As the greater the area of the sintered alumina body, the greater the 80° C. saturation energy, the formation of the sintered alumina body, for example, in a large planer shape is possible to make its area as large as possible when it is used as a substrate for power generation cells. It is also possible to subject the surface of the sintered alumina body to mirror finishing because the area of contact between the surface and the power generation cells can be increased when the surface is ground to reduce its roughness. The solar cell module may be constructed in a structure that the sintered alumina body is maintained in direct contact with the power generation cells because, when a bonding agent is used upon arrangement of the sintered alumina body on the back sides of the power generation cells, the bonding agent acts as a resistance upon transferring heat from the power generation cells to the sintered alumina body.

When the sintered alumina body according to the disclosed embodiments is applied to an LED light-emitting module and is used as a substrate for LED devices, the sintered alumina body can dissipate heat generated from the LED devices. As a consequence, it becomes possible to prevent a rise in the temperature of the LED devices, to inhibit a reduction in luminous efficiency and a reduction in service life, and further, prevent the potential occurrence of a fire accident due to the generation of heat. The present inventors studied the applicability of the sintered alumina body of the disclosed embodiments as a substrate for LED devices in an LED light-emitting module as will be described below. First, a sintered alumina body according to the disclosed embodiments was formed in the shape (outer diameter: 50 mm, thickness: 5 mm) shown in FIG. 28. On its surface, a thin film of a conductive metal such as silver, nickel or copper was formed by PVD (physical vapor deposition), CVD (chemical vapor deposition) or the like or an ink with the above-described metal contained as particles therein was printed, whereby a wiring 25 was formed. LED devices were placed on the thus-formed wiring, and were connected to the wiring with a conducive bonding agent. Further, the LED devices were sealed with a resin. A study was also made on one obtained by grinding a surface of a sintered alumna body before the formation of wiring such that the surface was smoothened to improve the heat dissipation performance. In the course of those studies, it was confirmed that the optical reflectance from LED devices can be increased when a titanium oxide particle layer of high whiteness is formed on a surface of a substrate or on a ground surface of a substrate. For the minimization of effects of such a titanium oxide particle layer it is possible to form as dense a particle layer as possible, although the heat radiation performance from a sintered alumina body is not interfered owing to the high thermal conductivity of titanium oxide.

Among sintered alumina bodies having the same surface area, the 80° C. saturation energy increases with the thickness as will be described subsequently herein. In other words, a sintered alumina body of greater thickness is superior in heat dissipation performance. It is, therefore, effective to form a sintered alumina body with a greater thickness when it is applied as a substrate for LED device or devices. However, an excessively large thickness produces a problem such that the resulting LED light-emitting module is large and heavy. It is, therefore, preferred to set the thickness, for example, at from 1.8 to 10 mm or so, with from 4.5 to 5 mm or so being more preferred.

Figure 28:
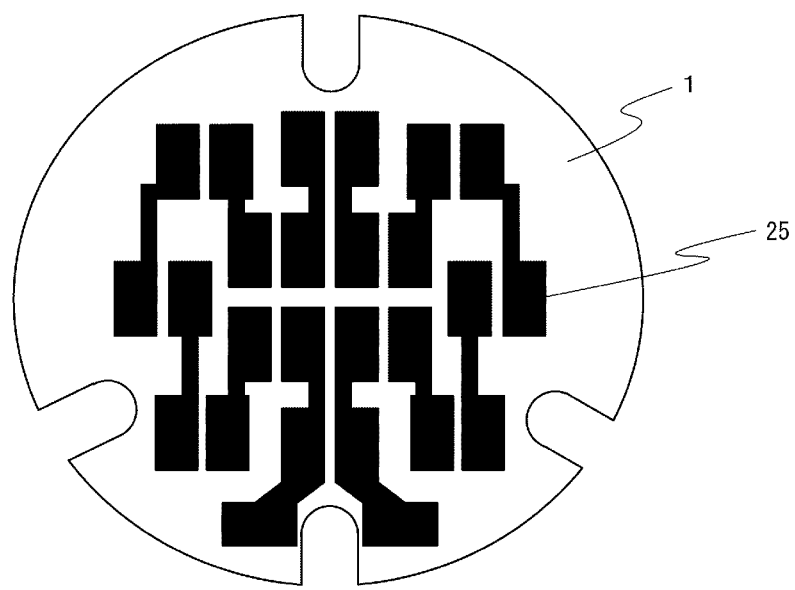
FIG. 28 is a diagram showing one example of a substrate for an LED light-emitting module, said substrate carrying a circuit formed on a surface thereof, as another one of the application examples of a ceramic of the disclosed subject matter.

As the sintered alumina body according to the disclosed embodiments has the structure that alumina crystal grains of specific crystal grain sizes have been densely sintered as mentioned above, its surface is smooth so that the formation of a thin metal film or the printing of a metal, such as that described above, can be easily conducted. Because the formation of a wiring pattern is easy as mentioned above, the pattern is not limited to FIG. 28, but a still more complex pattern can be formed. In this case, a still finer complex wiring pattern can be formed if the surface of the sintered alumina body according to the disclosed embodiments is improved in surface smoothness by surface grinding or the like. The sintered alumina body according to the disclosed subject matter can be obtained in a desired suitable shape, because as mentioned above, it can be readily obtained by the production process of the disclosed subject matter which fires a green compact and is excellent in processability. For example, a sintered alumina body which is not limited to such a disc shape as shown in FIG. 28 but has a shape desired corresponding to its application, such as one equipped with one or more recessed portions, may be applied as desired. As the sintered alumina body according to the disclosed embodiments has been densely sintered, the separation or destruction of crystal grains hardly occurs during cutting work and one or more recesses or through-holes can be easily formed in the sintered body. The sintered alumina body according to the disclosed embodiments can, therefore, be expected to find practical utility as a heat-radiating member in diverse applications. For example, it can be applied not only as a substrate for LED device or devices but also as a substrate for an IC package or power transistor which is fabricated by conducting the formation of a wiring in a complex pattern on desired one of substrates of various shapes. These IC packages, power transistors and the like also involve as a problem a deterioration due to heat generation, and the use of such sintered alumina substrates of excellent heat dissipation performance as substrates makes it possible to protect these products from deterioration and to provide them with a longer service life.

(Sintered Alumina Body with Far-infrared Radiation Film Formed on its Surface)

Although the sintered alumina body according to the disclosed embodiments has high thermal conductivity and thermal emissivity and is excellent in heat radiation performance as mentioned above, it was found according to a study by the present inventors that its heat radiation performance can be further improved when a far-infrared radiation film is formed on at least a part of a surface of the sintered alumina body to impart far-infrared radiation characteristics to the surface. Presumably, owing to the formation of the far-infrared radiation film on at least the part of the heat-radiating surface of the sintered alumina body, heat from a heat source (heat-generating portion or portions) may be converted into far-infrared rays at the surface of the far-infrared radiation film, and as a result, the heat may be more efficiently dissipated to the exterior. In a sintered alumina body in the form of a hexahedron (quadrangular prism), for example, the heat radiation performance of the sintered alumina body can be further improved if the faces (five faces) other than that to be maintained in contact with heat-generating portion or portions are provided as heat-radiating faces and far-infrared radiation films are formed on at least parts of the respective faces by using a far-infrared radiation coating composition. In this case, far-infrared radiation films may be formed on some parts or entire parts of the five faces other than the face to be maintained in contact with the heat-generating portion or portions, or the five faces other than the face to be maintained in contact with the heat source or sources may include, at parts thereof, faces with far-infrared radiation films formed thereon.

When forming the shape of the sintered alumina body according to the disclosed embodiments, for example, in the shape of a hexahedron, the sintered alumina body may be formed in such a shape that it is provided with a largest area at a face to be maintained in contact with the heating portion or portions of an electronic device or equipment where heat dissipation of is required. When the arrangement of a far-infrared radiation film is desired and the sintered alumina body is formed, for example, in a short quadrangular prism, the far-infrared radiation film may be formed on at least a part of a face located opposite a face which is to be maintained in contact with the heat-generating portion or portions. However, higher heat radiation performance is available as the area of the far-infrared radiation film becomes greater. To provide a sintered alumina body with higher heat radiation performance, it is, therefore, possible to make as large as possible the area in which a far-infrared radiation film is to be formed.

<Far-infrared Radiation Coating Composition)

The far-infrared radiation film is formed by applying a far-infrared radiation coating composition and then drying and baking the resulting coating. As a far-infrared radiation coating composition suited for the disclosed embodiments, the following composition can be mentioned. Described specifically, it is possible to use a far-infrared radiation coating composition containing (A) a heat-resistant inorganic bonding agent and (B) a calcined, fine powder mixture, which has been obtained by mixing at least two kinds of transition element oxides and calcining the resulting mixture at from 700 to 1,300° C., at a mass (A:B) ratio of from 97:3 to 20:80. As the heat-resistant inorganic bonding agent (A), a silica-alumina bonding agent is possible. As the transition element oxides, on the other hand, it is possible to provide $MnO_2$ and $Fe_2O_3$ as principal components, and in addition, to incorporate at least one compound selected from CoO, CuO and $Cr_2O_3$.

As described above, the far-infrared radiation coating composition may contain the components (A) and (B) at the mass ratio of from 97:3 to 20:80. If the calcined mixture (B) of the transition element oxides amounts to less than 3 mass %, the resulting film does not exhibit sufficient far-infrared radiation characteristics. If the calcined mixture (B) amounts to more than 80 mass %, on the other hand, the resulting composition is not provided with sufficient coating characteristics, thereby making it difficult to form a coating film. Among such far-infrared radiation coating compositions, those containing the calcined mixture (B) in a range of from 20 to 50 mass %, notably from 30 to 40 mass % are preferred from the standpoints of far-infrared radiation characteristics and coating characteristics.

As a possible composition of transition element oxides in the calcined mixture (B), the following mixing proportions can be mentioned by way of example.

$MnO_2$: 10 to 80 mass %
$Fe_2O_3$: 5 to 80 mass %
CoO: 5 to 50 mass %
CuO: 10 to 80 mass %
$Cr_2O_3$: 2 to 30 mass %

By changing the kinds and proportions of the transition element oxides in the above-described range, the wavelength range of infrared rays to be radiated from the resulting far-infrared radiation film can be changed. Therefore, the heat dissipation efficiency can be further enhanced by suitably designing the coating composition. When the proportions of transition element oxides are large, for example, the wavelengths of far-infrared rays are observed on the resulting far-infrared radiation film so that the heat dissipation performance can be enhanced further. However, the heat-resistant inorganic bonding agent may amount to at least 20 mass % to enable the formation of a coating.

The calcined mixture (B) may have particle sizes of from 1 to 50 μm. As a large particle size tends to produce irregularities on the surface of the resulting coating film and to induce peeling of the coating film, as small a particle size as possible is desirable. On the other hand, an excessively small particle size is inferior in workability. The above-described range is hence appropriate.

<Far-infrared Radiation Film>

No particular limitation is imposed on the far-infrared radiation film insofar as it is one formed, for example, by forming of a coating with a far-infrared radiation coating composition of the above-described formulation and then baking the coating. Described specifically, a far-infrared radiation film can be formed at each desired position on the surface of a sintered alumina body, for example, by applying a far-infrared radiation coating composition onto the surface of the sintered alumina body by brushing, spraying or the like, and after the application, drying and baking the resulting coating at a temperature of from 50 to 250° C. At this time, the thickness of the coating film may be set at from 0.1 to 0.5 mm. A thickness smaller than the lower limit cannot bring about sufficient far-infrared radiation effects. Even with a thickness greater than the upper limit, on the other hand, no improvements can be observed in far-infrared radiation effects. As the above-described far-infrared radiation coating composition undergoes no substantial shrinkage through the drying and baking, it is sufficient to apply the coating composition to a thickness desired for the resulting far-infrared radiation film.

The far-infrared radiation film formed as described above radiates far-infrared rays even when the surface temperature of its substrate is around room temperature (20° C.), but its far-infrared radiation effects become higher as it is heated to a higher temperature. At an elevated temperature higher than 100° C., for example, far-infrared rays are radiated more. When heated to a range of from approximately 500 to 650° C., the far-infrared radiation effects can be obtained sufficiently. As described above, the far-infrared radiation film generally becomes more effective for the conversion of heat to far-infrared rays as the surface temperature of its substrate increases. The ceramic according to the disclosed embodiments is used for cooling application at heat-generating portion or portions, and under this use condition, the surface temperature of the sintered alumina body is considered to be higher than room temperature (20° C.), for example, to reach 50 to 200° C. Sufficient heat dissipation effects can still be obtained even when the far-infrared radiation film is formed on the surface of the sintered alumina body as described above.

As mentioned above, the sintered alumina body according to the disclosed embodiments is high in thermal conductivity and thermal emissivity, and functions as a heat-radiating member excellent in cooling effects. When such a far-infrared radiation film as described above is formed on its surface, the heat radiation effects are further enhanced to make the sintered alumina body more suitable because the far-infrared radiation film efficiently radiates heat at far-infrared rays as will be demonstrated in experiments to be described below. When, for example, a hot heater is brought into contact with a sintered alumina body having a far-infrared radiation film formed on a surface thereof, the surface temperature of the heater can be substantially lowered compared with the contact with a sintered alumina body with no far-infrared radiation film formed on a surface thereof as will be demonstrated in the experiments to be described below. Concerning the below-described thermal resistance value usable as an index of heat irradiation performance, the sintered alumina body having the far-infrared radiation film formed on the surface thereof is also smaller in this value than the sintered alumina body with no far-infrared radiation film formed on the surface thereof, thereby verifying that the former sintered alumina body is excellent in heat dissipation performance and is advantageous for lowering the temperature of an object maintained in contact with the sintered alumina body. In this respect, a description will be made subsequently herein.

EXAMPLES

The disclosed embodiments will next be described in further detail based on examples and comparative examples.
(Ceramics for Heat-radiating Members)

Example 1

As a raw-material powder, an alumina powder obtained by the Bayer process was used. The used alumina powder was one having an average particle size of 0.7 µm. The raw material contained alumina at 99.5 mass %, magnesia at 0.16 mass %, and silica at 0.34 mass %. The alumina powder was placed together with water in a ball mill (ball material: alumina-based material), followed by grinding and mixing for 10 hours. The average particle size of the thus-obtained powder was measured by a laser diffraction/scattering particle size analyzer, and was found to be 3 µm. An organic binder (an acrylic resin and polyvinyl alcohol) were added to the powder to formulate a slurry. The slurry was spray-dried to prepare granules of from 50 to 100 µm. Using a mold, the resultant granules were pressed at a forming pressure of 2,000 kg/cm$^2$ by the dry forming method to obtain a planar green compact having a size of 20 mm long, 30 mm wide and 5 mm thick. The density of the green compact was 2.40 g/cm$^3$.

The resulting green compact was placed in a debinding furnace, and was heated from room temperature to 500° C. over 100 hours to conduct debinding. After having been allowed to cool, the green compact was taken out, placed in a gas furnace, and heated at a heating rate of 150° C./hr to 1,580° C., at which the green compact was held for 2 hours in an air atmosphere. Subsequently, air of room temperature was introduced into the furnace to conduct cooling at 258° C./hr. The firing profile is shown in FIG. 1. The gas furnace was an air-circulating batch furnace, and used the combustion of propane gas as a heat source. The temperature control was performed by adjusting the flow rate of the propane gas and the flow rate of air to be mixed in the propane gas. The resulting ceramic for a heat-radiating member had been densely sintered, and was slightly smaller compared with the green compact before the firing.

Example 2

A ceramic for a heat-radiating member was obtained in a similar manner as in Example 1 except that the firing temperature was set at 1,583° C.

Example 3

A ceramic for a heat-radiating member was obtained in a similar manner as in Example 1 except that the firing temperature was set at 1,555° C.

Example 4

A ceramic for a heat-radiating member was obtained in a similar manner as in Example 1 except that the firing temperature was set at 1,592° C.

Example 5

A ceramic for a heat-radiating member was obtained in a similar manner as in Example 1 except that the firing temperature was set at 1,570° C.

Example 6

A ceramic for a heat-radiating member was obtained in a similar manner as in Example 1 except that as a raw-material powder, an alumina powder obtained by the sol-gel method was used. The used alumina raw-material powder was substantially free of impurities and had high purity (alumina content: 99.95%), and was 0.5 µm in average particle size. Further, its particle shape was close to a true spherical shape.

Example 7

A ceramic for a heat-radiating member was obtained in a similar manner as in Example 1 except that as a raw-material powder, an alumina powder obtained by the sol-gel method and having an average particle size of 0.3 µm was used and the firing temperature was set at 1,550° C. Similar to Example 6, the alumina content in the alumina raw-material powder was 99.95%. Further, its particle shape was close to a true spherical shape.

Example 8

A ceramic for a heat-radiating member was obtained in a similar manner as in Example 1 except that as a raw-material powder, an alumina powder similar to that used in Example 7 was used and the firing temperature was set at 1,500° C. In this example, a 2-hour firing was not sufficient, and a longer time was needed for the firing.

Example 9

A ceramic for a heat-radiating member was obtained in a similar manner as in Example 1 except that as a raw-material powder, an alumina powder similar to that used in Example 7 was used and the firing temperature was set at 1,600° C. In this example, crystal growth was locally observed with a 2-hour firing, thereby needing to shorten the firing time.

Comparative Example 1

A ceramic for a heat-radiating member was obtained in a similar manner as in Example 1 except that the firing temperature was set at 1,611° C.

Comparative Example 2

A ceramic for a heat-radiating member was obtained in a similar manner as in Example 1 except that the firing temperature was set at 1,630° C.

Comparative Example 3

A ceramic for a heat-radiating member was obtained in a similar manner as in Example 1 except that the firing temperature was set at 1,650° C.

Comparative Example 4

A ceramic for a heat-radiating member was prepared in a similar manner as in Example 7 except that the firing temperature was set at 1,470° C. In this example, it was found that firing did not proceed sufficiently even when conduced for a long time.

<Evaluation A (Characteristics of Ceramics for Heat-radiating Members)>

Figure 13:
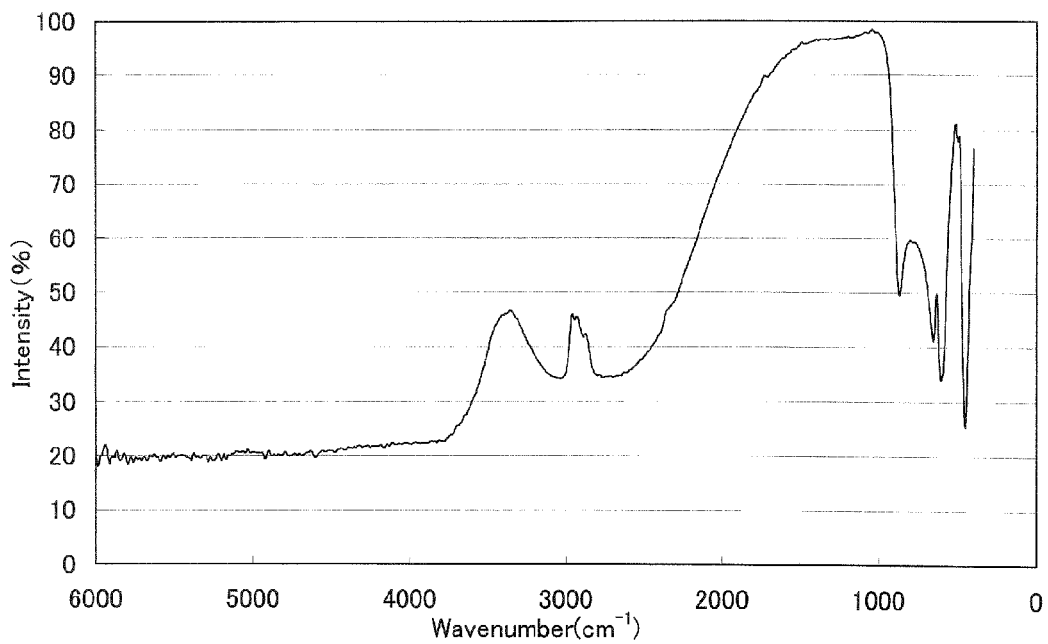
FIG. 13 is an FT-IR reflectivity spectrum of a ceramic (sintered alumina body) according to the disclosed subject matter for a heat-radiating member.

The above-obtained ceramics of Examples 1 to 7 and Comparative Examples 1 to 3 were each measured for density, crystal grain size, crystal population, thermal shock resistance temperature, flexural strength, thermal conductivity and insulation resistance according to the below-described methods. The measurement results are presented in Table 1. With respect to the ceramics of Examples 1 to 4, 7 and 8 and Comparative Examples 1 to 3, their surface crystal structures were also observed under a scanning electron microscope (SEM). The observation results are shown in FIG. 2 through FIG. 11. Concerning the ceramic of Example 1, its thermal emissivity and total emissivity were also measured according to the below-described methods, and the resulting measurement spectrum is shown in FIG. 13. The thermal emissivity indicates a highest value of spectral emissivity. According to a study by the present inventors, however, when sintered alumina bodies are compared in thermal emissivity, those having greater values of thermal emissivity are superior in heat dissipation performance. Thermal emissivity can, therefore, be used as an index for the determination of heat dissipation performance.

[Density]

Measured by the Archimedes method. Described specifically, each specimen was formed in a disc shape having a size of 30 mm across and 5 mm thick. Its dry weight (W1) after drying at 100° C. for 2 hours and its wet weight (W2) were measured, respectively, and the density was determined according to density $=(W1)/(W1-W2)$.

[Crystal Grain Size and Crystal Population]

Determined by an observation under a scanning electron microscope (SEM). Described specifically, each specimen having a size of 10 mm across and 5 mm thick was subjected at a surface thereof to thermal etching at 1,550° C., followed by vapor deposition of gold. The crystal grain structure of its surface was observed under the scanning electron microscope (manufactured by JEOL Ltd.). From the thus-obtained micrograph (×3,000), the population of crystals existing in an area of 30×20 μm (the grains included in their entirety in the above-described area) was counted. With respect to each of the crystal grains, the maximum dimensions of the crystallin both horizontal and vertical directions were measured, respectively. The average of those dimensions was recorded as a crystal grain size. The population of crystals and crystal grain size were measured at three different positions each of which had an area of 30×20 μm.

[Thermal Shock Resistance]

Determined by the submerged quenching method. Described specifically, specimens (diameter: 30 mm, thickness: 5 mm) were held for 30 minutes in constant-temperature chambers set at temperatures of 120, 170, 220, 320 and 370° C., respectively, and were then submerged in water of 20° C. After the submersion, each specimen was checked with a flaw detection liquid for possible cracks or breakage visually or by a microscopic observation. The temperature difference between the highest temperature, at which neither cracks nor breakage was observed, and 20° C. was recorded as a thermal shock resistance temperature.

[Flexural Strength]

Measured by the 3-point bending test. Described specifically, each specimen of 4 mm long, 40 mm wide and 3 mm thick was measured by 3-point bending on a flexural strength testing machine.

[Thermal Conductivity]

Measured by using a thermal conductivity measuring instrument which makes use of the laser flash method. As each measurement specimen, a mirror-finished specimen having a size of 10 mm across and 3 mm thick was used. After the density of the specimen was measured by the above-described Archimedes method, its specific heat and thermal diffusion coefficient were measured by using the measurement instrument, and its thermal conductivity (W/m·K) was calculated by the following formula.

$$\text{Thermal conductivity}=(\text{density})\times(\text{specific heat})\times(\text{thermal diffusion coefficient})$$

[Insulation Resistance]

Measured by using an insulation resistance meter. As each measurement specimen, a specimen prepared under the corresponding conditions and having a cubic shape, the length, width and height of which were each 10 mm, was used. Silver electrodes were arranged on opposite two faces of the specimen, respectively, and its insulation resistance was measured by the insulation resistance meter.

[Thermal Emissivity]

Thermal emissivity was determined by measuring a temperature rise on a surface of a heating element according to the hot plate method (measuring instrument: "HFT-40 THERMOMETER", manufactured by Anritsu Meter Co., Ltd.). Described specifically, a mica heater was used as the heating element. After an application voltage was adjusted to maintain constant the temperature of a surface (upper side) of the heating element, each ceramic was maintained in close contact with the surface of the heating element. The thermal emissivity of the ceramic was then determined by measuring the surface temperature of the heating element at a part thereof where the ceramic was not in close contact with the heating element.

[Total Emissivity]

According to JIS R1801 (Method of measuring spectral emissivity of ceramics useful as radiating members for infrared heaters by using FTIR), total emissivity was measured. A Fourier transform infrared spectrophotometer (FT-IR: "SYSTEM 2000", manufactured by PerkinElmer Co., Ltd.) was used. Each specimen was formed in a shape of 50 mm long, 50 mm wide and 5 mm thick, and its reflection spectrum was measured at room temperature over a measurement wavelength range of from 370 to 7,800 cm$^{-1}$ (effective range: 400 to 6,000 cm$^{-1}$). From the resulting spectral emissivity, the spectral emissivity at each wavelength was measured. The thus-obtained measurement values were averaged over the entire wavelength range to determine the total emissivity.

all fell within the range of from 2 to 4 μm. This applies equally to the remaining examples, i.e., Examples 2 to 7 and Comparative Examples 1 to 3. The average of the grain sizes of the crystal grains observed in Example 1 was 3 μm. Similarly, the averages of the crystal grain sizes in the remaining examples were 3 μm in Examples 2 and 3, 4 μm in Example 4, 2 μm in Example 5, 2 μm in Example 6, and 2 μm in Example 7, and therefore, the average of the crystal grain sizes in each of the examples was substantially equal to the median of the range of its crystal grain sizes. Although no data are presented in Table 1 with respect to the ceramics of Examples 8 and 9, the sintered bodies were substantially the same in characteristics such as density and crystal grain size as that of Example 7.

The ceramics of Examples 1 to 9 were sintered bodies, all of which had excellent thermal shock resistance and high thermal conductivity and were excellent in thermal characteristics. They were also dense sintered bodies high in flexural strength and excellent in mechanical characteristics.

TABLE 1

Various Characteristics of Individual Ceramics for Heat-radiating Elements

| | Firing temp. (° C.) | Density of sintered body (g/cm$^3$) | Crystal grain size (μm) | Crystal population (crystals/ 30 × 20 μm) | Thermal conductivity (W/m · K) | Flexural strength (MPa) | Thermal shock resistance (° C.) | Insulation resistance (Ω · cm) |
|---|---|---|---|---|---|---|---|---|
| Ex. 1 | 1,580 | 3.93 | 2 to 4 | 36 to 45 | 39 | 400 | 300 | >10$^{16}$ |
| Ex. 2 | 1,583 | 3.93 | 2 to 4 | 35 to 44 | 39 | 400 | 300 | >10$^{16}$ |
| Ex. 3 | 1,555 | 3.82 | 2 to 4 | 38 to 47 | 37 | 380 | 320 | >10$^{16}$ |
| Ex. 4 | 1,592 | 3.91 | 3 to 5 | 32 to 40 | 39 | 400 | 300 | >10$^{16}$ |
| Ex. 5 | 1,570 | 3.90 | 1 to 3 | 30 to 35 | 36 | 390 | 310 | >10$^{16}$ |
| Ex. 6 | 1,580 | 3.93 | 1 to 3 | 40 to 51 | 39 | 490 | 320 | >10$^{16}$ |
| Ex. 7 | 1,550 | 3.96 | 1 to 3 | 40 to 55 | 41 | 520 | 320 | >10$^{16}$ |
| Comp. Ex. 1 | 1,611 | 3.85 | 4 to 15 | 23 | 34 | 370 | 270 | >10$^{15}$ |
| Comp. Ex. 2 | 1,630 | 3.81 | 5 to 10 | 20 | 33 | 360 | 250 | >10$^{15}$ |
| Comp. Ex. 3 | 1,650 | 3.70 | 7 to 20 | 13 | 31 | 200 to 250 | 100 to 150 | >10$^{14}$ |

As presented in Table 1, each of the sintered alumina bodies of Examples 1 to 5 in which the firing temperature was from 1,555 to 1,592° C. was dense and contained from 30 to 55 crystals in 30×20 μm, and a large majority of its crystal grain sizes ranged from 1 to 5 μm. Further, as shown in FIGS. 2 to 6, no grain growth of crystals is observed, the crystal grains of the above-described size were in a uniformly-sintered form. In addition, no segregation of silica was observed at interfaces of crystal grains.

In Examples 6 to 9 in which the alumina powder obtained by the sol-gel method was used, dense sintered bodies were also obtained. However, each of those sintered bodies had still smaller crystal grain sizes of from 1 to 3 μm, and, compared with Examples 1 to 5 in which the alumina powder obtained by the Bayer process was used as a raw material, had a greater population of crystals in 30×20 μm, was denser, and had higher thermal conductivity and flexural strength. As areas on for this, it may be presumed that the raw-material powder had higher purity, more uniform particle sizes, and a particle shape close to a true sphere. In Example 5 in which the alumina powder obtained by the Bayer process was used, the crystal grain sizes also ranged from 1 to 3 μm. As a reason for this, the grain growth of crystals was presumably suppressed because the firing temperature was lower than that in Example 6.

The crystal grain sizes in Example 1 are presented to range from 2 to 4 μm in Table 1. This indicates that the smallest and largest values of grain size as measured by the above-described method were 2 μm and 4 μm, respectively, and that the crystal grains observed in the observation area of 30×20 μm Although not presented in Table 1, all the ceramics of Examples 1 to 9 had a thermal emissivity of 0.97, and therefore, were high in thermal emissivity. Concerning each of Comparative Examples 1 to 3, the thermal emissivity was also calculated from the corresponding value of thermal conductivity as presented in Table 1. The thermal emissivity was 0.91 in Comparative Example 1, 0.88 in Comparative Example 2, and 0.85 in Comparative Example 3. These values are smaller than the corresponding values of the ceramics of the examples.

On the ceramic of Example 1, the total emissivity was measured by using FT-IR. It was found to be 70.6%. The value of total emissivity was determined by averaging values of spectral emissivity over the wavelength range of from 370 to 7,800 cm$^{-1}$ (effective range: 400 to 6,000 cm$^{-1}$) in which the total emissivity was measured, and converting the thus-obtained average to a value at 100° C. In FIG. 13, a spectral emissivity spectrum measured by using FT-IR is shown. As depicted in FIG. 13, the ceramic of Example 1 showed a maximum emissivity around 1,100 cm$^{-1}$, and its spectral emissivity was 0.97.

As sintered alumina bodies of high purity are objects to be measured in the disclosed embodiments, no substantial differences arise in spectral emissivity spectrum even if there are differences among their crystal grain sizes. In the comparative examples studied as described above, the same raw material as in the example was used, and the firing temperature was varied in a narrow range. No substantial differences were, hence, observed in maximum emissivity or total emissivity, or especially in spectral emissivity. Accordingly, it has been confirmed that whether or not a given sintered alumina body is one intended by the disclosed embodiments and equipped with excellent heat dissipation performance can be sufficiently predicted from its heat dissipation performance without conducting an application test if its thermal conductivity and crystal grain size are used as indices. If the proportion of a sintering aid in a raw material is increased, for example, a clear difference obviously arises in spectral emissivity spectrum. It is, therefore, believed to be effective for the quality control of a ceramic product for a heat-radiating member to use its spectral emissivity spectrum or its spectral emissivity determined from the spectrum.

The ceramics of Comparative Examples 1 to 3 contained crystal grains of grain sizes smaller than 10 μm, but crystals greater than 10 μm were also observed, thereby indicating crystal growth had proceeded. As a consequence of the inclusion of such large crystals, the population of crystals contained in 30 μm×20 μm was small. In addition, coarsening due to the grain growth of crystals was also observed (FIGS. 9 to 11) The average crystal grain size was from 8 to 15 μm. Segregation of glassy silica was also observed at the interfaces of crystal grains.

(Composition and Characteristics of Far-infrared Radiation Film)

Referential Example 1

The following transition element oxides were mixed, and calcined at 800° C.
$MnO_2$: 50 mass %
$Fe_2O_3$: 35 mass %
CoO: 5 mass %
CuO: 10 mass %

To 70 mass % of a silica-alumina bonding agent, 30 mass % of the above-obtained, calcined fine powder of the transition element oxides were added. The resulting mixture was thoroughly mixed in a ball mill to obtain a far-infrared radiation coating composition. The coating composition was applied with a thickness of 0.25 mm onto the surface of one side of a stainless steel plate (SUS-304; length and width: 50 mm, each, thickness: 1 mm) as a substrate, and was then baked at 120° C. for 30 minutes to obtain a coated plate having a far-infrared radiation film.

Figure 14:
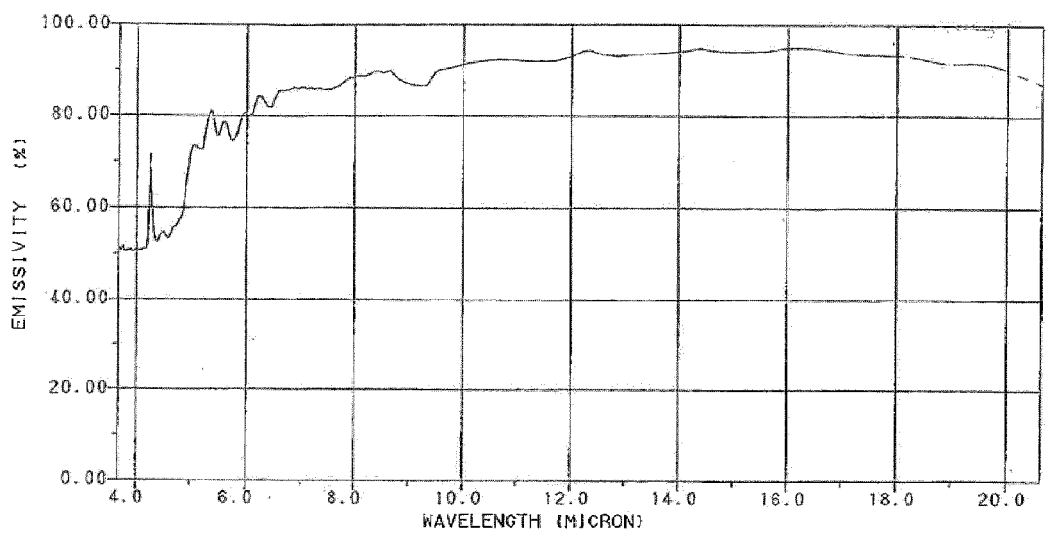
FIG. 14 is an FT-IR reflectivity spectrum depicting the intensity of radiation from the far-infrared radiation film of Referential Example 1.

Similar to the above-described total emissivity of the sintered alumina bodies, the far-infrared radiation intensity of the plate obtained as described above was measured at a measurement temperature of 141.6° C. by the Fourier transform infrared spectrophotometer (FT-IR: "SYSTEM 2000", manufactured by PerkinElmer Co., Ltd.) according to JIS R1801 (Method of measuring spectral emissivity of ceramics useful as radiating members for infrared heaters by using FTIR). The thus-obtained spectral emissivity spectrum is shown in FIG. 14. It is appreciated from FIG. 14 that the coated plate having the far-infrared radiation film exhibited a far-infrared radiation intensity of from 90 to 95% in a wavelength range of from 10 to 20 μm.

Figure 15:
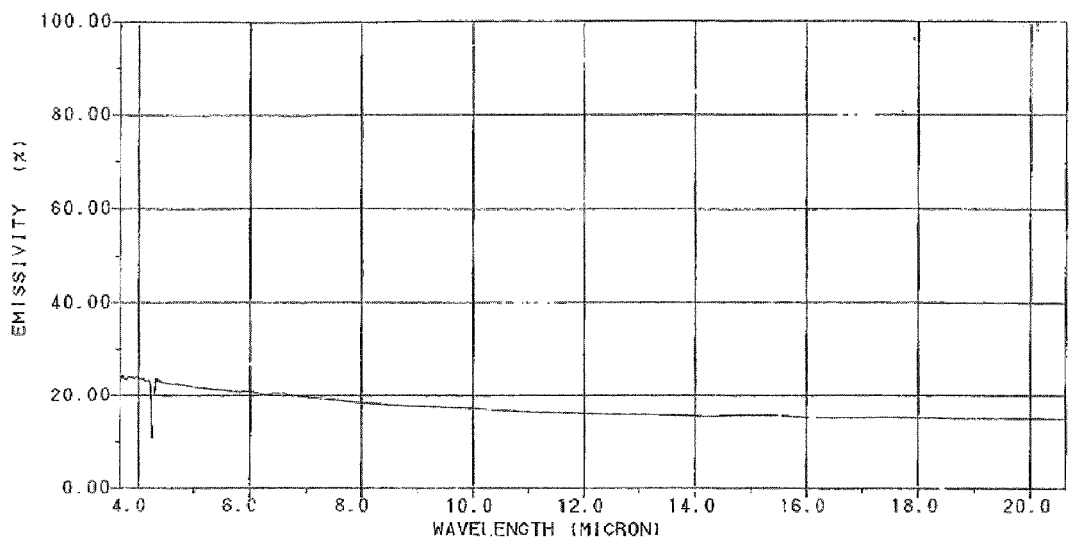
FIG. 15 is an FT-IR reflectivity spectrum depicting the intensity of radiation from a stainless steel plate on which no far-infrared radiation film was formed.

As a comparison, the far-infrared radiation intensity of a stainless steel plate itself, said stainless steel having been coated with no coating composition, was measured. With respect to a stainless steel plate (SUS-304; length and width: 50 mm, each, thickness: 1 mm) which was the same as that having the far-infrared radiation film formed thereon as described above, the far-infrared radiation strength was measured at a measurement temperature of 144.9° C. in a similar manner as described above. The thus-obtained spectral emissivity spectrum is shown in FIG. 15. As indicated in FIG. 15, the radiation intensity of the stainless steel plate was from 15 to 20% in a wavelength range of from 4 to 20 μm. It is, therefore, appreciated that no substantial radiation of far-infrared rays took place from the stainless steel plate as the substrate with the far-infrared radiation film formed thereon as described above and that the above-described far-infrared radiation intensity in the wavelength range of from 10 to 20 μm as exhibited by the coated plate having the far-infrared radiation film in FIG. 14 was mostly derived from the far-infrared radiation film.

(Sintered Alumina Body Having Far-infrared Radiation Film)

Example 10

In a similar manner as in Example 1, two sintered alumina bodies having a planar shape (length and width: 50 mm, each, thickness: 5 mm) were prepared. The far-infrared radiation coating composition of Referential Example 1 was applied onto the surface (50 mm×50 mm) of one side of one of the thus-obtained sintered alumina bodies by using a spray gun of 2 mm nozzle diameter, and was then baked at a temperature of 250° C. to form a far-infrared radiation film. The resulting sintered alumina body was provided as the sintered alumina body of this example having the far-infrared radiation film.

<Evaluation B (Heat Dissipation Characteristics of a Ceramic for a Heat-radiating Member)>

(B-1) Heater Surface Temperature, Heat-dissipated Temperature Fall, Thermal Resistance Value)

The sintered alumina body of Example 10, which was obtained as described above and had the far-infrared radiation film, and the other sintered alumina body, which was prepared in Example 10, had no far-infrared radiation film and was different only in size from Example 1 (herein after called "the specimens of the sintered alumina body of Example 1), were measured for heater surface temperature, heat-dissipated temperature fall and thermal resistance value upon heating, and their heat radiation characteristics (heat dissipation performance) were evaluated according to the methods to be described subsequently herein. In addition, a similar evaluation was also performed on a sintered alumina body, which was 50 mm long and wide and 5 mm thick and was different only in size from the sintered alumina body of Example 7 (herein after called "the specimens of the sintered alumina body of Example 7"). The respective sintered alumina bodies used in the test were all as-sintered, and had not been subjected to grinding processing.

To verify the heat-radiating effects of the ceramic according to the disclosed embodiments for the heat-radiating member, especially the heat-radiating effects improved owing to the formation of the far-infrared radiation film on the sintered alumina body, a metal copper plate useful as a material for a heat sink (as a comparative example) and one obtained by forming a far-infrared radiation film on such a metal copper plate as a substrate were provided, and similar measurements were performed to compare differences between them. Described specifically, a planar metal copper plate of 50 mm long and wide and 5 mm thick (Comparative Example 5) and a metal copper plate obtained by forming a far-infrared radiation film on the planar upper surface (50 mm×50 mm) of such a copper plate in a similar manner as in Example 10 were used. Specific measuring methods and calculation methods are as will be described below. The results are collectively presented in Tables 2 to 4.

[Heater Surface Temperature Upon Heating]

Figure 16:
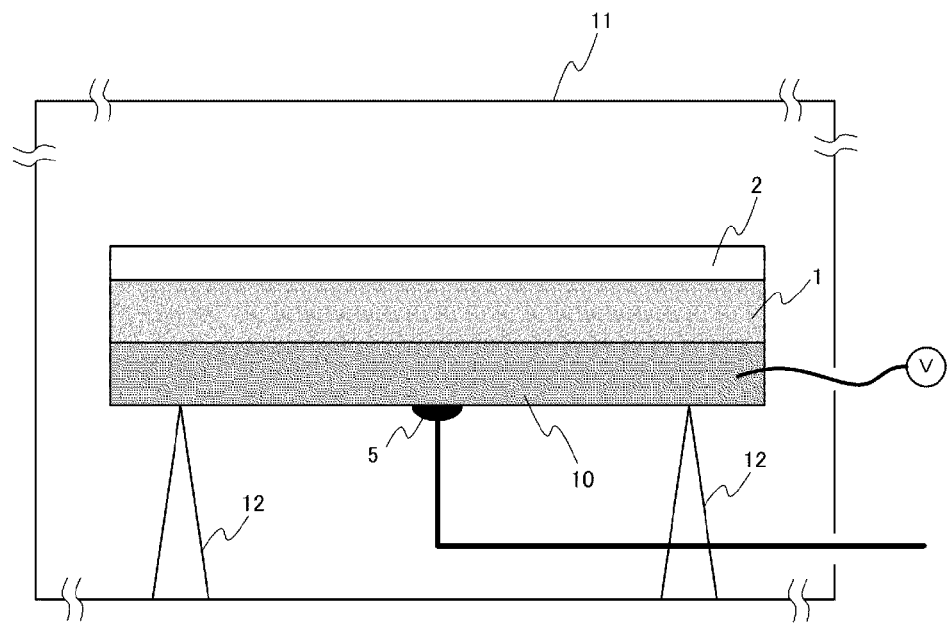
FIG. 16 is a concept diagram illustrating a method for measuring the surface temperature of a heater with Example 10 in Evaluation (B-1).
Figure 17:
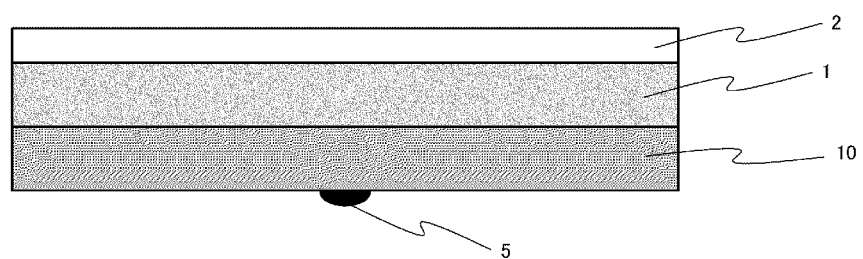
FIG. 17 is a view illustrating the arrangement of a heater and a temperature sensor upon measurement of the surface temperature of the heater with respect to the sintered alumina body of Example 10 which had a far-infrared radiation film.

Employed as a heater (heat source) was one having a planar shape of 50 mm long and wide and 4 mm thick, made of SUS at a surface thereof, and internally including a built-in mica heater. As illustrated in FIG. 17, the sintered alumina body 1 of Example 10, which had the far-infrared radiation film 2, was placed on an upper surface of the heater 10, with a 50 mm×50 mm face on a side of the sintered alumina body, said side being not provided with the film 2, facing down, whereby they were brought into close contact with each other. A temperature sensor 5 (K-type thermocouple, model: "HFT-40", manufactured by Anritsu Meter Co., Ltd.) was attached to a lower surface of the heater, the heater was energized, and upon elapsed time of 30 minutes after the initiation of the energization, the heater surface temperature was measured. In Table 2, the heater surface temperatures when the electric power to be applied was set at 1, 3, 5 and 7 W, respectively, are all presented. As illustrated in FIG. 16, the temperature measurement was performed in a glass-made measurement box (length: 260 mm, width: 220 mm, height: 360 mm) by setting the lower surface of the heater at a height 50 mm apart from a bottom wall of the box while using supports, and closing the box tight with a cover also made of glass. The temperature measurement was performed at intervals of 1 minute after the initiation of the energization of the heater. Depending on the applied electric power, there were some differences, but after the elapse of about 20 minutes, the temperature was no longer observed to change and remained constant in each measurement. The temperature after 30 minutes was, therefore, used as a measurement temperature.

Figure 18:
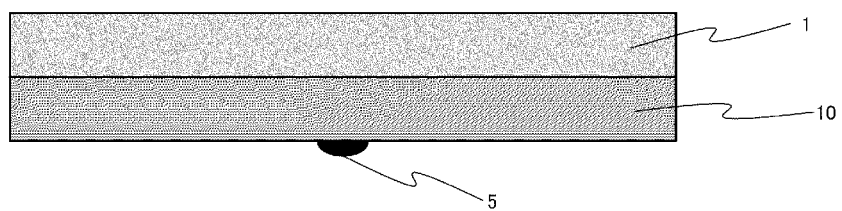
FIG. 18 is a view illustrating the arrangement of a heater and a temperature sensor upon measurement of the surface temperature of the heater with respect to the sintered alumina body of Example 1.

As illustrated in FIG. 18, with respect to the sintered alumina bodies 1 of Example 1 and Example 7 provided with no far-infrared radiation film, changes in heater surface temperature were also measured after the lapse of 30 minutes from the initiation of the energization in a similar manner as described above. In regard to the metal copper plate of Comparative Example and the metal copper plate of Comparative Example 6, the latter metal copper plate being provided with the far-infrared radiation film formed on one of the surfaces thereof, changes in heater surface temperature were also measured after the lapse of 30 minutes from the initiation of energization in a similar manner as described above. The results are presented in Table 2. To calculate falling rates of temperature, the heater surface temperature was also measured in regard to the heater 10 alone with nothing placed thereon after the elapse of 30 minutes from the initiation of the energization. The measurement results are presented under "heater alone" in Table 2.

TABLE 2

Measurement Values of Heater Surface Temperatures

| Applied electric power (W) | Heater alone (° C.) | Ex. 1 (° C.) | Ex. 7 (° C.) | Ex. 10 (° C.) | Comp. Ex. 5 (° C.) | Comp. Ex. 6 (° C.) |
|---|---|---|---|---|---|---|
| 1 | 49.8 | 43.7 | 42.5 | 42.9 | 46.4 | 44.5 |
| 3 | 81.6 | 71.8 | 70.3 | 68.9 | 75.9 | 74.3 |
| 5 | 108.5 | 96.8 | 95.3 | 92.3 | 102.2 | 99.7 |
| 7 | 131.3 | 120.6 | 118.0 | 113.5 | 124.5 | 122.2 |

[Heat-dissipated Temperature Fall]

With respect to each of the sintered alumina body of Example 10, which had the far-infrared radiation film, the sintered alumina bodies of Example 1 and Example 7, the metal copper plate of Comparative Example 5, and the metal copper plate of Comparative Example 6, which had the far-infrared radiation film, the differences between the heater surface temperatures at the respective applied electric powers and the heater surface temperatures when the heater was singly heated at the corresponding surface temperatures were calculated as heat-dissipated temperature falls, and the results are all presented in Table 3. Further, the falling rates (%) of the heater surface temperatures by the super position of the respective specimens were calculated by comparing the heater surface temperatures with the surface temperatures of the heaters alone, and are all presented in parentheses in Table 3. Compared with the metal copper plate as a conventional heat-sink material, evidently significant differences are observed in the falling rate of temperature on all the sintered alumina bodies of the examples of the disclosed subject matter. It has therefore been confirmed that the sintered alumina body according to the disclosed embodiments is useful as a heat-sink material. It has also been confirmed that the falling rate of temperature can be further increased by making the particle size of an alumina raw-material powder, which is to be used upon production of a sintered alumina body, finer, more uniform and closer to a true spherical shape and/or forming a far-infrared radiation film on one side thereof. In particular, the formation of a far-infrared radiation film is very effective. As the use of an alumina powder, which is finer, closer to a true spherical shape and has a uniform particle size, involves a problem from the standpoint of cost, the method that forms a far-infrared radiation film is effective upon practical application.

TABLE 3

Evaluation of Heat Irradiation Performance (temperature fall and falling rate of temperature)

| Applied electric power (W) | Ex. 1 (° C.) | Ex. 7 (° C.) | Ex. 10 (° C.) | Comp. Ex. 5 (° C.) | Comp. Ex. 6 (° C.) |
|---|---|---|---|---|---|
| 1 | 6.1 (12.2%) | 7.3 (14.7%) | 6.9 (13.9%) | 3.4 (6.8%) | 5.3 (10.6%) |
| 3 | 9.8 (12.0%) | 11.3 (13.8%) | 12.7 (15.6%) | 5.7 (7.0%) | 7.3 (8.9%) |
| 5 | 11.7 (10.8%) | 13.2 (12.2%) | 16.2 (14.9%) | 6.3 (5.8%) | 8.8 (8.1%) |
| 7 | 10.7 (8.1%) | 13.3 (10.1%) | 17.8 (13.6%) | 6.8 (5.2%) | 9.1 (6.9%) |

[Thermal Resistance Value]

Further, using the values obtained in the above-described measurements of the heat-dissipated temperature falls, thermal resistance values were calculated and evaluated by the below-described methods with respect to the respective sintered bodies. Described specifically, the thermal resistances values were calculated by the below-described method by using the values of the respective heater surface temperatures when the electric power to be applied was set at 1 W and 7 W, respectively, as presented in Table 2. More specifically, the difference between each heater surface temperature at the applied electric power of 1 W and the corresponding heater surface temperature at the applied electric power of 7 W as shown in Table 2 was calculated, a value was calculated by dividing this difference with the difference (6 W) in applied electric power, and the value was recorded as a thermal resistance value (° C./W). Thermal resistance values calculated as described above are presented in Table 4.

TABLE 4

Thermal Resistance Values (between 1 W and 7 W)

| | Thermal resistance value (° C./W) |
|---|---|
| Heater alone | 13.6 |
| Example 1 | 12.8 |
| Example 7 | 12.6 |
| Example 10 | 11.8 |
| Comp. Ex. 5 | 13.0 |
| Comp. Ex. 6 | 13.0 |

The results of Table 4 indicates especially that the application of the method, which involves the formation of a far-infrared radiation film on the surface of a sintered alumina body, has capability of further enhancing the heat-dissipation effects. According to the calculation results of thermal resistance value presented in Table 4, no significant difference associated with the formation of a far-infrared radiation film on a surface is observed between the comparative examples conducted on the metal copper plates, respectively. It has, therefore, been found that the effects of the far-infrared radiation film are high especially in the case of the sintered alumina body according to the disclosed embodiments. It has also been confirmed that the sintered alumina bodies of the examples are superior in heat radiation performance (heat dissipation performance) to the metal copper plate as a conventional heat-sink material and are useful materials as heat-radiating members and that the heat radiation performance (heat dissipation performance) can be further improved by forming far-infrared radiation films on the surfaces of the sintered alumina bodies and the sintered alumina bodies with the far-infrared radiation films can be expected to bring about still higher effects as heat-radiating members.

It is to be noted that as a thermal resistance value, one calculated by the above-described method was adopted in the disclosed embodiments although it is generally expressed as shown by the following equation (1):

$$\text{Thermal resistance}(° C./W) = (T2-T1)/W \quad (1)$$

as a ratio of a difference between the surface temperature (T1) of a heater and the surface temperature (T2) of a tested object to an electric power (W) applied to the heater in a state that the heater and the tested object are maintained in contact with each other.

(B-II) Thickness-dependent Differences in Heat Radiation Performance

Using sintered alumina bodies (specimens of the sintered alumina body of Example 1) produced at varied thicknesses under the same material and firing conditions as in Example 1, the sintered alumina bodies were studied for thickness-dependent differences in heat radiation performance. Described specifically, with respect to the specimens which had the same heater-contacting area but were different in thickness, differences in heat radiation performance were evaluated by measuring temperatures of the surface of a heater and the surface of each specimen when the specimen was heated by the heater in an apparatus illustrated in FIG. 19. The apparatus illustrated in FIG. 19 was the same in basic structure as the apparatus illustrated in FIG. 16 and used for the above-described evaluation of heat radiation characteristics in (B-I), but in this test, each specimen and the heater were held upright in a vertical direction and the surface temperature of the specimen was also measured at the same time on the side not in contact with the heater. The measurement was conducted in a box (440 mm long, 170 mm wide, and 170 mm high) made of transparent acrylic-resin plates of 3 mm thick.

Provided as the sintered alumina bodies 1 were five(5) different specimens, which were 23 mm long and wide (surface area: 530 mm$^2$), had the same surface area on sides thereof to be maintained in contact with the heater, and had different thicknesses of 4.5 mm, 5.5 mm, 6.5 mm, 7.5 mm and 8.5 mm, respectively. A resistance heater 10 of 20 mm long, 10 mm wide and 2 mm thick was maintained in close contact with an approximately central part of a face of 23 mm long and 23 mm wide of each specimen (area of contact: 200 mm$^2$), and temperature sensors 5 were attached to the surface of the heater and the surface of the sintered alumina body, respectively. The sintered alumina body 1 was held upright in a vertical direction on a wooden base 13, the heater was energized, and the temperatures of the surface of the heater and the surface of the sintered alumina body were measured, respectively, after the lapse of each of times. The temperatures after the lapse of the respective times are presented in Tables 5-1 and 5-2 and in FIG. 20. With respect to the heater alone, its surface temperature was also measured after the lapse of each of predetermined times. The surface temperatures so measured are also presented in Tables 5-1 and 5-2 and FIG. 20.

Figure 20:
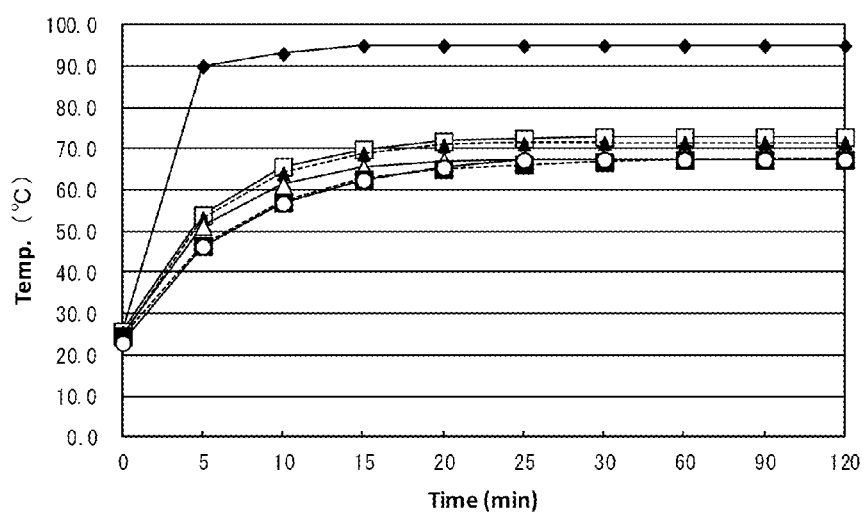
FIG. 20 is a graph showing thickness-dependent differences in heat radiation characteristics of the sintered alumina body according to the disclosed subject matter when the area was set to be constant. In the graph, the ♦ plots indicate surface temperatures of a heater when the heater was measured alone, while the □, ▲, ∆, ■ and ○ plots indicate surface temperatures of heater when sintered alumina bodies of 4.5 mm thick, 5.5 mm thick, 6.5 mm thick, 7.5 mm thick and 8.5 mm thick were brought into contact with the heater.

Shown in FIG. 20 are changes in the surface temperature of the heater when the sintered alumina bodies of the different thicknesses were maintained in close contact. As a result, it was found that, when the sintered alumina bodies were each maintained in contact with the heater, the surface temperature of the heater stably remained around 70° C. in each case while the surface temperature of the heater was 95° C. in the case of the heater alone. It is appreciated from Tables 5-1 and 5-2 that the surface temperature of each sintered alumina body on the side opposite to the heater was similar. This indicates that by arranging the sintered alumina body of Example 1 of the disclosed embodiments on heat-generating portion or portions, thermal energy continuously applied by the heat-generating portion or portions is continuously dissipated from the sintered alumina body. Although the effect of heat dissipation increases with the thickness of the sintered alumina body, the surface temperature of the heater was maintained at temperatures not higher than 73° C., that is, at temperatures lower by at least 20° C. than the temperature of the heater even in the case of the one of 4.5 mm thick. With the thicknesses of 6.5 mm and greater, the surface temperature of the heater was maintained at 70° C. or lower. Even with the thicknesses greater than 6.5 mm, the surface temperature did not change much from that in the case of 6.5 mm. The sintered alumina body of whichever thickness was used, the surface temperature of the heater had become constant in about 60 minutes after the initiation of the energization of the heater. The temperatures, at which the heater surface temperatures had reached constant, are presented as equilibrium temperatures together with heat radiation effects (the differences between the heater surface temperature in the case of the heater alone and the above-described equilibrium temperatures), corresponding to the thicknesses of the respective sintered alumina bodies, in Table 6. As indicated in Table 6, the equilibrium temperature did not change much even when the thickness was great. This means that, even if the thickness of a sintered alumina body is increased, this increase is not much effective for the improvement of its heat radiation performance when an area—which is maintained in contact with the surface of a heater and is contained in the area of a face of the sintered alumina body, said face being on a side where the sintered alumina body is maintained in contact with the heater—is the same. Insofar as the above-described test conditions are concerned, a sintered alumina body that shows a sufficient function as a heat-radiating member (heat-dissipating material) can be considered to have a thickness of from 4 to 6 mm or so.

TABLE 5-1

| Time after initiation of energization (min) | Heater alone (♦ in FIG. 20) Surface temp. of heater (° C.) | 4.5 mm thick (□ in FIG. 20) | | 5.5 mm thick (▲ in FIG. 20) | |
|---|---|---|---|---|---|
| | | Surface temp. of heater (° C.) | Surface temp. of sintered alumina body (° C.) | Surface temp. of heater (° C.) | Surface temp. of sintered alumina body (° C.) |
| 0 | 26.0 | 25.8 | 25.7 | 24.7 | 24.7 |
| 5 | 90.0 | 54.0 | 51.4 | 53.3 | 47.6 |
| 10 | 93.0 | 65.7 | 62.4 | 64.1 | 57.4 |
| 15 | 95.0 | 69.9 | 67.5 | 68.9 | 61.4 |
| 20 | 95.0 | 71.8 | 69.3 | 70.9 | 62.6 |
| 25 | 95.0 | 72.5 | 69.8 | 71.3 | 62.7 |
| 30 | 95.0 | 72.9 | 70.1 | 71.5 | 62.7 |
| 60 | 95.0 | 72.9 | 70.1 | 71.5 | 62.7 |
| 90 | 95.0 | 72.9 | 70.1 | 71.5 | 62.7 |
| 120 | 95.0 | 72.9 | 70.1 | 71.5 | 62.7 |

TABLE 5-2

| Time after initiation of energization (min) | 6.5 mm thick (Δ in FIG. 20) | | 7.5 mm thick (■ in FIG. 20) | | 8.5 mm thick (○ in FIG. 20) | |
|---|---|---|---|---|---|---|
| | Surface temp. of heater (° C.) | Surface temp. of sintered alumina body (° C.) | Surface temp. of heater (° C.) | Surface temp. of sintered alumina body (° C.) | Surface temp. of heater (° C.) | Surface temp. of sintered alumina body (° C.) |
| 0 | 25.1 | 25.1 | 24.7 | 24.7 | 23.0 | 23.0 |
| 5 | 51.3 | 48.2 | 46.5 | 44.0 | 46.4 | 42.5 |
| 10 | 61.3 | 58.3 | 57.1 | 54.5 | 56.8 | 53.3 |
| 15 | 65.5 | 62.6 | 62.7 | 59.9 | 62.4 | 58.4 |
| 20 | 67.1 | 64.1 | 65.1 | 62.4 | 65.5 | 61.6 |
| 25 | 67.3 | 64.2 | 66.2 | 63.5 | 67.3 | 63.2 |
| 30 | 67.5 | 64.5 | 66.8 | 64.1 | 67.4 | 63.3 |
| 60 | 67.5 | 64.5 | 67.4 | 64.6 | 67.4 | 63.3 |
| 90 | 67.5 | 64.5 | 67.4 | 64.6 | 67.4 | 63.3 |
| 120 | 67.5 | 64.5 | 67.4 | 64.6 | 67.4 | 63.3 |

TABLE 6

| Thickness of sintered alumina body (mm) | Heater temperature (° C.) | Equilibrium temperature (° C.) | Heat radiation effects (° C.) |
|---|---|---|---|
| 4.5 | 95.0 | 72.9 | −22.1 |
| 5.5 | 95.0 | 71.5 | −23.5 |
| 6.5 | 95.0 | 67.5 | −27.5 |
| 7.5 | 95.0 | 67.4 | −27.6 |
| 8.5 | 95.0 | 67.4 | −27.6 |

Using, as specimens of the sintered alumina body of Example 1, planar sintered alumina bodies fixed in volume and different in thickness, in other words, sintered alumina bodies having different surface areas on heater sides thereof, heat radiation performance was evaluated. Differences in heat radiation performance were evaluated by measuring temperatures of the surface of a heater and the surface of each sintered alumina body when the sintered alumina body was heated by the heater in an apparatus illustrated in FIG. 21. The apparatus illustrated in FIG. 21 was the same in basic structure as the test apparatus illustrated in FIG. 19, but in this test, the measurement was conducted with the sintered alumina body and heater being supported in a horizontal direction. The measurement was conducted in the same box (440 mm long, 170 mm wide, and 170 mm high) made of transparent acrylic-resin plates as in FIG. 19.

Provided as the sintered alumina bodies 1 to be evaluated were three(3) different specimens, which were (A) a specimen of 31.0 mm long, 18.0 mm wide and 5.0 mm thick, (B) another specimen of 19.4 mm long, 18.0 mm wide and 8.0 mm thick, and (C) a further specimen of 14.1 mm long, 18.0 mm wide and 11.0 mm thick. Their volumes were A: 2,790 mm$^3$, B: 2,794 mm$^3$ and C: 2,792 mm$^2$, and therefore, were substantially the same. A resistance heater 10 of 20 mm long, 10 mm wide and 2 mm thick was maintained in close contact with an approximately central part of each of the specimens A to C (area of contact: 200 mm$^2$), and temperature sensors were attached to the surface of the heater and the surface of the sintered alumina body. The sintered alumina body 1 was supported on a wooden base 13 such that the heater 10 was located on the downside, the heater 10 was energized, and the temperatures of the surface of the heater 10 and the surface of the sintered alumina body 1 were measured, respectively, upon lapse of respective times after the initiation of the energization. The respective temperatures after the lapse of the predetermined times are presented in Tables 7-1 and 7-2. With respect to the heater alone, its surface temperature was also measured upon lapse of the respective predetermined times after the initiation of energization. The surface temperatures so measured are also presented in Table 7-1. Further, with respect to the heater alone and the sintered alumina bodies A to C, changes in heater surface temperature are illustrated in FIG. 22.

Figure 22:
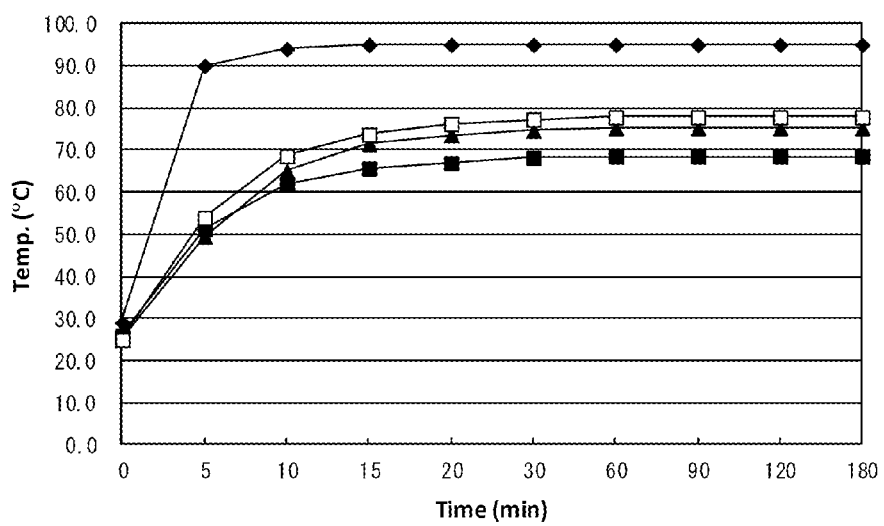
FIG. 22 is a graph showing thickness-dependent differences in heat radiation characteristics of the sintered alumina body according to the disclosed subject matter when the volume was set to be constant. In the graph, the ♦ plots indicate surface temperatures of a heater when the heater was measured alone, while the ■, ▲ and □ plots indicate surface temperatures of the heater when a sintered alumina body A (the length, width and thickness of which were 31.0 mm, 18.0 mm and 5.0 mm, respectively), a sintered alumina body B (the length, width and thickness of which were 19.4 mm, 18.0 mm and 8.0 mm, respectively) and a sintered alumina body C (the length, width and thickness of which were 14.1 mm, 18.0 mm and 11.0 mm, respectively) were brought into contact with the heater.

As presented in Tables 7-1 and 7-2 and illustrated in FIG. 22, the heater surface temperature was maintained at temperatures not higher than 80° C. which ever sintered alumina body was used. It has, therefore, been confirmed that sintered alumina bodies of these shapes exhibit high heat radiation performance. It has also been appreciated from the results of Tables 7-1 and 7-2 and Table 8 that a sintered alumina body tends to exhibit higher heat radiation performance as an area—which is maintained in contact with the surface of a heater and is contained in the area of a face of the sintered alumina body, said face being on a side where the sintered alumina body is maintained in contact with the heater—becomes smaller. This indicates that, when a sintered alumina body has the same volume, it is effective for an improvement in heat radiation performance to have a shape such that an area of the sintered alumina body on the side, where it is maintained in contact with the surface of the heater, becomes wider.

TABLE 7-1

| Time after initiation of energization (min) | Heater alone (♦ in FIG. 22) Surface temp. of heater (° C.) | Specimen (A) (thickness: 5 mm, area on heater-contacting side: 558 mm$^2$; ■ in FIG. 22) | |
|---|---|---|---|
| | | Surface temp. of heater (° C.) | Surface temp. of sintered alumina body (° C.) |
| 0 | 29.0 | 25.9 | 25.9 |
| 5 | 90.0 | 51.3 | 49.5 |
| 10 | 94.0 | 62.0 | 59.8 |
| 15 | 95.0 | 65.6 | 63.4 |
| 20 | 95.0 | 66.9 | 64.5 |
| 30 | 95.0 | 68.2 | 65.6 |
| 60 | 95.0 | 68.5 | 65.8 |
| 90 | 95.0 | 68.5 | 65.8 |
| 120 | 95.0 | 68.5 | 65.8 |
| 180 | 95.0 | 68.5 | 65.8 |

TABLE 7-2

| Time after initiation of energization (min) | Specimen (B) (thickness: 8 mm, area on heater-contacting side: 349 mm$^2$, ▲ in FIG. 22) | | Specimen (C) (thickness: 11 mm, area on heater-contacting side: 254 mm$^2$, □ in FIG. 22) | |
|---|---|---|---|---|
| | Surface temp. of heater (° C.) | Surface temp. of sintered alumina body (° C.) | Surface temp. of heater (° C.) | Surface temp. of sintered alumina body (° C.) |
| 0 | 24.9 | 24.8 | 25.0 | 24.9 |
| 5 | 49.5 | 48.1 | 53.9 | 51.9 |
| 10 | 65.0 | 63.4 | 68.6 | 66.3 |
| 15 | 71.5 | 69.9 | 73.7 | 71.5 |
| 20 | 73.6 | 72.2 | 76.2 | 73.5 |
| 30 | 74.6 | 73.0 | 77.3 | 74.3 |
| 60 | 75.2 | 73.5 | 77.8 | 74.5 |
| 90 | 75.2 | 73.5 | 77.8 | 74.5 |
| 120 | 75.2 | 73.5 | 77.8 | 74.5 |
| 180 | 75.2 | 73.5 | 77.8 | 74.5 |

TABLE 8

| Thickness of sintered alumina body (mm). Parenthesized value indicates the percentage (%) of the area of heater to the area of face in contact with the heater. | Heater temperature (° C.) | Equilibrium temperature (° C.) | Heat radiation effects (° C.) |
|---|---|---|---|
| 5 mm (36%) | 95.0 | 68.5 | −26.5 |
| 8 mm (56%) | 95.0 | 75.2 | −19.8 |
| 11 mm (71%) | 95.0 | 77.8 | −17.2 |

[B-III] 80° C. Saturation Energy

With respect to each of specimens of the sintered alumina body of Example 1 (sintered alumina bodies produced under the same raw material and firing conditions as in Example 1), "80° C. saturation energy" was measured by the below-described method to evaluate the heat radiation performance (heat dissipation performance) of ceramics of the disclosed embodiments for heat-radiating members. The term "80° C. saturation energy" as used herein means a quantity of energy to be applied for maintaining at 80° C. the temperature of a heater maintained in contact with a sintered alumina body (electric power (W) to be applied). In other words, the term "80° C. saturation energy" as used herein means a maximum quantity of energy with which the temperatures of the heater and sintered alumina body are maintained without exceeding 80° C. owing to the dissipation of the same quantity of heat from the sintered alumina body when the quantity of energy is progressively increased. The greater the value of 80° C. saturation energy, the better the heat dissipation performance. Described specifically, 80° C. saturation energy was measured by using the apparatus illustrated in FIG. 23.

Figure 19:
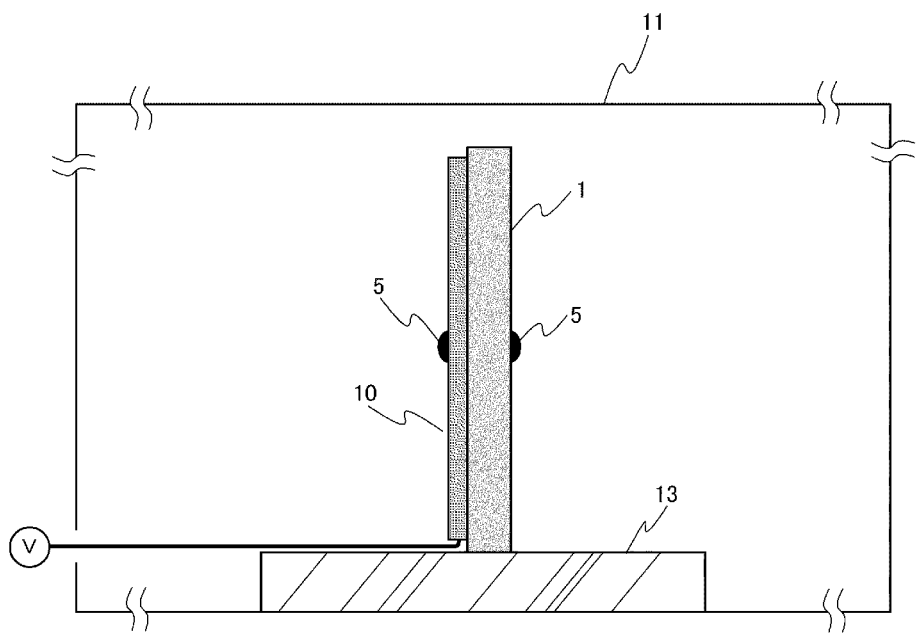
FIG. 19 is a concept diagram illustrating a method for measuring the surface temperatures of a heater and each specimen of the sintered alumina body of Example 1 in Evaluation (B-II).
Figure 21:
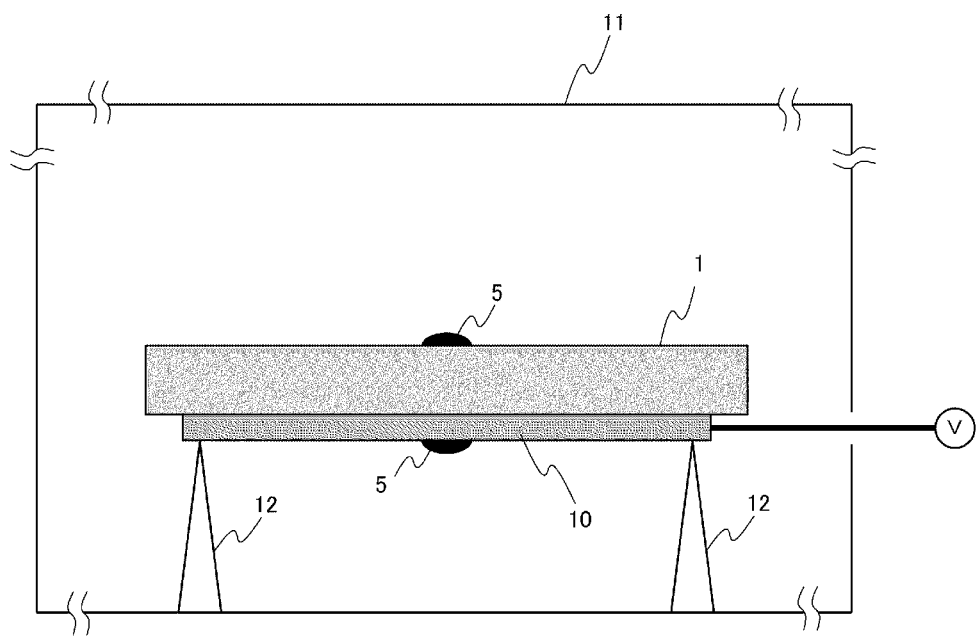
FIG. 21 is a concept diagram illustrating another method for measuring the surface temperatures of the sintered alumina body of Example 1 and a heater in Evaluation (B-II).
Figure 23:
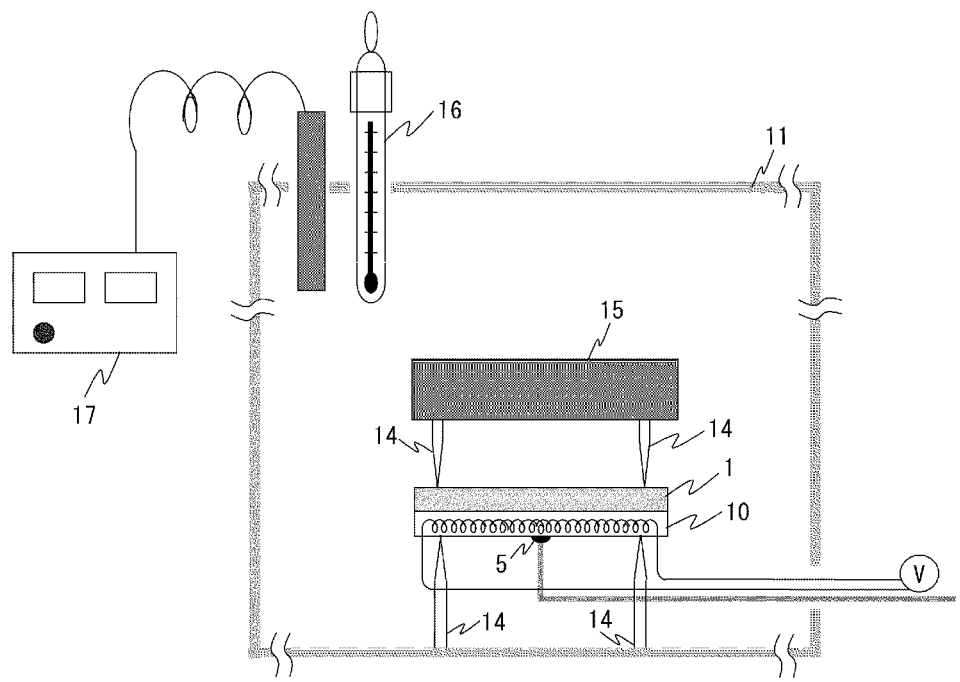
FIG. 23 is a concept diagram illustrating a method for measuring the surface temperature of a heater with Example 1 in Evaluation (B-III).

The apparatus illustrated in FIG. 23 is the same in basic structure as the test apparatus illustrated in FIG. 16 and used for the evaluation of heat radiation characteristics in (B-I) and those illustrated in FIG. 19 and FIG. 21 and used for the evaluation of heat radiation performance in (B-II). In this test, however, bamboo-made needles 14 (outer diameter: 3 mm, length: 50 mm, thermal conductivity: 0.15 W/m·K) were placed upright in four corners, one needle per corner, of each object to be measured, such as a sintered alumina body, and a weight 15 was placed on the needles such that the load on the sintered alumina body reached 40 kgf/m$^2$. With the sintered alumina body 1 being maintained infirm and close contact with the resistance heater 10 and the heater 10 being supported at four corners on its lower side by similar needles 14 as described above, a measurement was conducted. As the weight 15, a ceramic-made rectangular parallelepiped (25 mm long, 45 mm wide, 130 mm thick) containing alumina at 90 mass % therein was used. With the sintered alumina body 1 being tightly enclosed in a glass-made box 11 similar to the test apparatus of FIG. 16, the measurement was conducted with a thermometer 16 and an air speedometer 17 (Model: "AM-B11/11-2111") arranged in the box 11 by setting the temperature and wind velocity in a range of from 20 to 25° C. and at 0.05 m/sec or lower as measurement initiation conditions, and further, while recording the temperature and wind velocity during measurements. It is to be noted that during the measurement, the wind velocity inside the box was in a windless state of substantially 0 m/sec.

Figure 24:
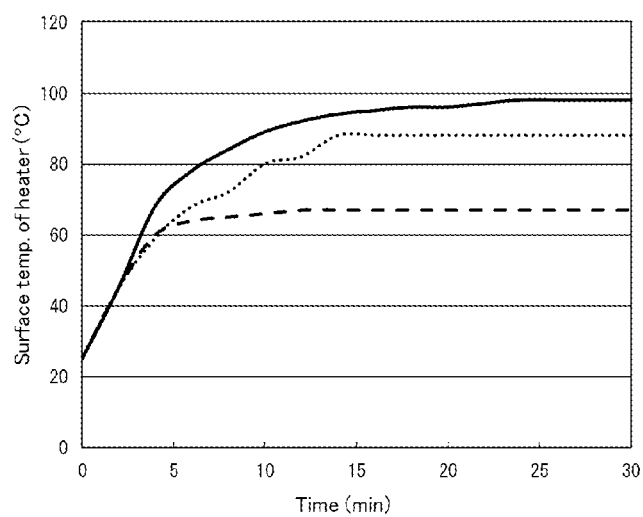
FIG. 24 is a graph showing changes in the surface temperature of a heater when the applied electric power was 3 W. In the graph, the solid line corresponds to the case of the heater alone, the broken line corresponds to the case in which a sintered alumina body was superposed on the heater, and the dotted line corresponds to the case in which a copper plate was superposed on the heater.

The above-described test apparatus was used, and on an upper surface (20 mm×40 mm) of a resistance heater 10 having a size of 20 mm long, 40 mm wide and 2 mm thick, a specimen of the sintered alumina body 1 of Example 1, which had the same size as the heater 10, was superposed. A temperature sensor 5 (K-type thermocouple, model: "HFT-40", manufactured by Anritsu Meter Co., Ltd.) was attached to a lower surface of the heater to perform a measurement. The heater 10 was first energized with an applied electric power of 3 W, and changes in heater surface temperature after the initiation of the energization of the heater are shown in FIG. 24. In FIG. 24, the broken line indicates the changes in temperature when the measurement was performed with the specimen of the sintered alumina body 1 being superposed on the heater, and the dotted line indicates changes in temperature when a copper plate (the thermal emissivity of which was smaller than 0.1) of the same size as the specimen of the sintered alumina body 1 was superposed and measured. The solid line indicates changes in heater surface temperature as measured in the case of the heater alone.

As shown in FIG. 24, the surface temperature of each heater reached close to 100° C. by the energization with the applied electric power of 3 W, but upon super position of the copper plate, fell by about 10° C. When the specimen of the sintered alumina body was superposed on the surface of the heater, the surface temperature of the heater fell further by more than 20° C. and reached equilibrium at about 68° C. It was also found that the time required to reach the equilibrium was about 13 minutes shorter when the specimen of the sintered alumina body was superposed on the surface of the heater. It has been confirmed from the foregoing that the sintered alumina body according to the disclosed embodiments is excellent in heat dissipation performance than a copper plate, and moreover, that the dissipation of heat takes place quickly following a rise in the surface temperature of a heater with which the sintered alumina body is maintained in contact, whereby the surface temperature of the heater can be promptly lowered to 70° C.

With the specimen of the sintered alumina body being still kept interposed on the surface of the heater, the electric power to be applied to the heater was next progressively raised further to increase the quantity of energy to be applied such that the electric power was adjusted to maintain the surface temperature of the heater at 80° C. The applied electric power (4.5 W) when the surface temperature of the heater had reached constant at 80° C. was recorded as 80° C. saturation energy. With respect to the case that the copper plate was superposed on the surface of the heater, a test was also conducted likewise. As the surface temperature of the heater reached 80° C. without any adjustment to the electric power to be applied, that applied electric power (3.0 W) was recorded as 80° C. saturation energy.

Figure 25:
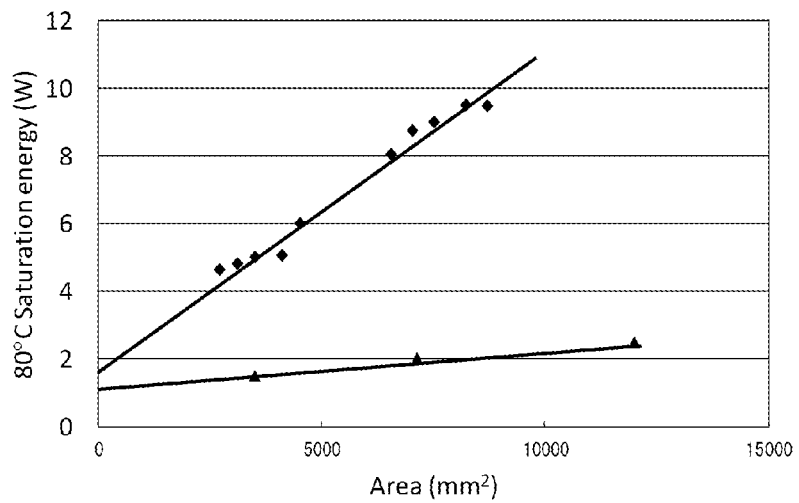
FIG. 25 is a graph representing values of 80° C. saturation energy for varied areas with respect to a sintered alumina body according to the disclosed subject matter and a copper plate. In the graph, the ♦ plots correspond to the sintered alumina body, and the ▲ plots correspond to the copper plate.

Provided were sintered alumina bodies (specimens of the sintered alumina body of Example 1), which were produced under the same raw material and firing conditions as in Example 1 but had shapes of different areas at which the specimens were to be maintained in contact with their corresponding heaters. Each specimen was superposed on the corresponding heater having the same size as a contacting face of the specimen, and was measured for 80° C. saturation energy in a similar manner as described above. With respect to specimens of a copper plate, their 80° C. saturation energy were measured in a similar manner as described above. Values of 80° C. saturation energy as measured as described above are presented in FIG. 25, in which the areas (length×width) of the specimens of the sintered alumina body and the specimens of the copper plate are plotted along the abscissa. It is appreciated from FIG. 25 that in each of the cases of the sintered alumina body represented by ♦ and the copper plate represented by ▲, the 80° C. saturation energy increased in proportion to the area of contact with the heater. It has been found from a comparison between both of them that, when the area of the sintered alumina body is, for example, about 10,000 $m^2$, its 80° C. saturation energy is about 9 times as large as the corresponding copper plate and the sintered alumina body is extremely good in heat radiation effects. It is to be noted that with respect to the sintered alumina body and the copper plate, the values at which their extrapolated lines intersect the ordinate (0 on the abscissa), respectively, are the quantities of energy transferred via needles.

Sintered alumina bodies (specimens of the sintered alumina body of Example 1), which were different in shape as will be described below, were next produced, respectively, under the same raw material and firing conditions as in Example 1, and those specimens were each measured for 80° C. saturation energy by the above-described method making use of the test apparatus illustrated in FIG. 23. Described specifically, specimens of the sintered alumina body were produced in a size of 70 mm long and 90 mm wide at the varied thicknesses presented in Table 9, and other specimens of the sintered alumina body were also produced in a size of 50 mm long and 50 mm wide at the varied thicknesses presented in Table 9. Measurement values of 80° C. saturation energy on those specimens are presented in Table 9. It is appreciated from the results of Table 9 that among sintered alumina bodies having the same heater-contacting area, the 80° C. saturation energy increases with the thickness. Comparing the specimens of the same thickness, the 80° C. saturation energy has a correlation with the heater-contacting area, and irrespective of the thickness, the greater specimens showed a little smaller than twice the 80° C. saturation energy of the corresponding smaller specimens in the above-described test.

TABLE 9

| Thickness | 80° C. saturation energy (W) | |
|---|---|---|
| (mm) | Area 70 × 90 mm | Area 50 × 50 mm |
| 1 | 8.06 (1.7 times)* | 4.65 |
| 3 | 8.75 (1.8 times)* | 4.82 |
| 5 | 9.01 (1.8 times)* | 5.02 |
| 8 | 9.52 (1.9 times)* | 5.1 |
| 10 | 9.49 (1.6 times)* | 6.0 |

*Each parenthesized value indicates the multiple of the 80° C. saturation energy of the corresponding specimen of 50 × 50 mm in area.

In the above-described tests (B-III), the tests were each conducted by using the sintered alumina bodies (the specimens of the sintered alumina body of Example 1) all of which had been obtained under the same production conditions as in Example 1 but were different in shape. The respective specimens used in each test were used without grinding their surfaces, and were tested in close contact with the corresponding heaters without inter position of any bonding agent between themselves and the corresponding heaters. As it has been confirmed from the results of the above-described evaluation (B-I) that a sintered alumina body having a far-infrared radiation film on a surface thereof also exhibits similar or better heat radiation characteristics as the sintered alumina body, a sintered alumina body even with a far-infrared radiation film formed thereon is believed to have similar heat dissipation effects or still better heat radiation effects.

<Evaluation C (Application of Ceramic for Heat-radiating Member—Application to Solar Cell Module)

Because the sintered alumina body according to the disclosed embodiments has great 80° C. saturation energy as demonstrated in the above-described tests (B-III), its application to a solar cell module was studied.

Figure 26:
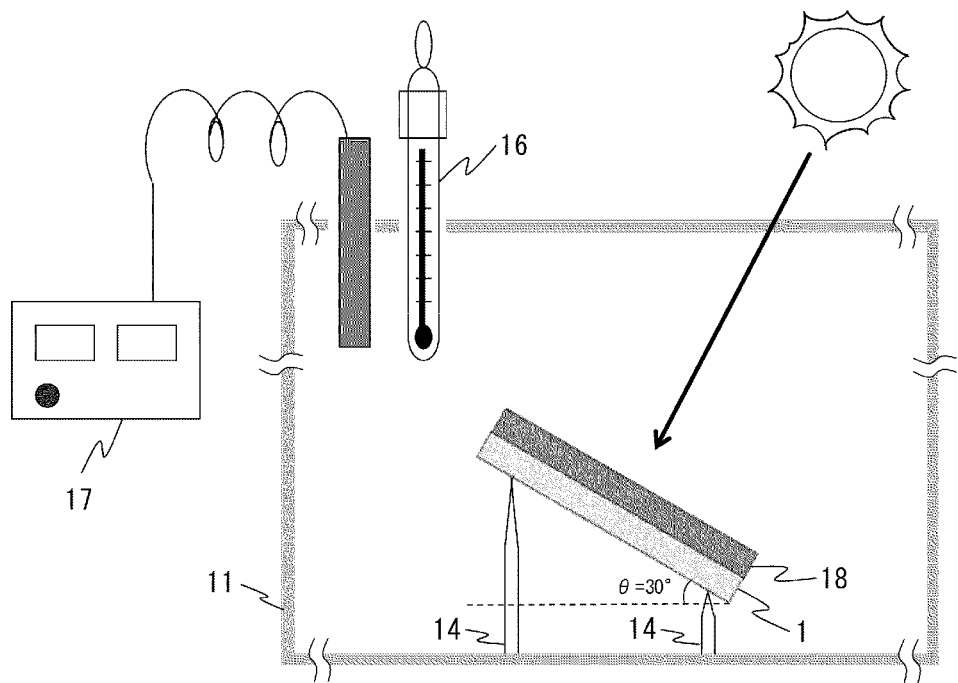
FIG. 26 is a diagram illustrating one example of an experimental setup for measuring the radiative cooling effect of a solar cell module as one of application examples of a ceramic of the disclosed subject matter for a heat-radiating member.

As illustrated in FIG. 26, power generating capability was measured when a sintered alumina body 1, which had been obtained under the production conditions of Example 1, was arranged on a back side (a side opposite to a sunlight-receiving side) of a power generation cell 18. Using, as the power generation cell, a cell formed of polycrystalline silicon and capable of generating an electromotive force of 0.72 A (Isc) and 0.6V (Voc), a test was conducted as will be described below. On similar needles 14 as the supports illustrated in FIG. 23, the sintered alumina body 1 was supported at a slant at four corners thereof such that the power generation cell 18 arranged on the sintered alumina body was lying at an angle of 30° relative to a horizontal plane. The resulting test assembly was set in the same glass-made box 11 as that illustrated in FIG. 23, and was placed outdoors such that the power generation cell would be fully exposed to sunlight. The inside of the glass box was in a windless state of 0.05 m/sec or lower in wind velocity before and during the measurement. On the other hand, the temperature was from 35 to 40° C. before the initiation of the measurement. In a similar manner as described above, the power generating capability of the power generation cell was also measured with a glass plate arranged in place of the sintered alumina body. The results are both shown in FIG. 27, in which the ■ plots correspond to the case in which the sintered alumina body was arranged, and the ◆ plots correspond to the case in which the sintered alumina plate was not arranged (the glass plate was arranged). The glass plate and sintered alumina body were dimensioned at 50 mm in both length and width and 5 mm in thickness.

Figure 27:
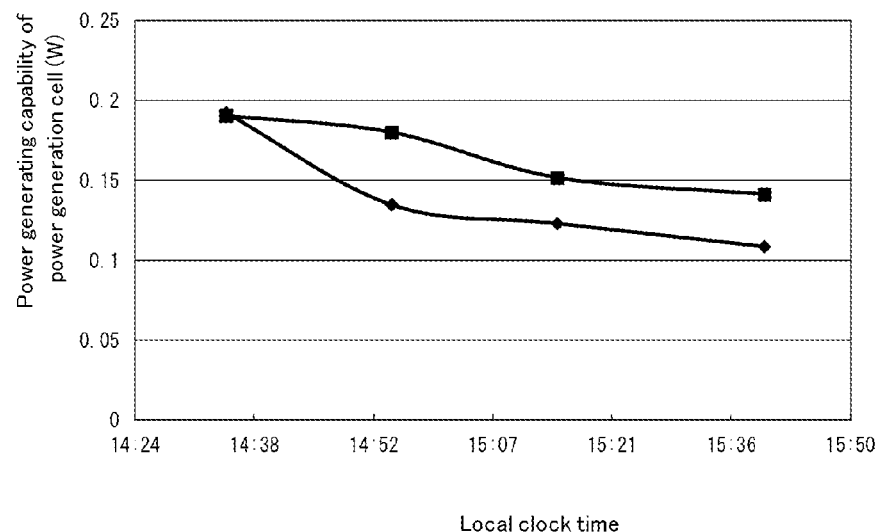
FIG. 27 is a graph showing power generating capabilities measured in FIG. 26. In the graph, the ■ plots correspond to the case in which a sintered alumina body according to the disclosed subject matter was arranged, and the ♦ plots correspond to the case in which a glass plate was arranged instead of the sintered alumina plate.

As shown in FIG. 27, the power generating capability of the power generation cell was higher by a maximum 26% in the case (the ■ plots) in which the sintered alumina body was placed on the back side than in the case (the ◆ plots) in which the sintered alumina body was not placed. It has, therefore, been demonstrated that the ceramic of the disclosed embodiments for the heat-radiating member can be used as a cooling system for a solar cell module. Further, the ceramic of the disclosed embodiments for the heat-radiating member is excellent in heat radiation characteristics, and such an improvement in the efficiency of power generation as described above is observed when it is simply arranged in contact with a solar cell module. It has, therefore, been suggested that the ceramic of the disclosed embodiments for the heat-radiating member is effective as a cooling system for the solar cell module.

In the above-described test, the test was conducted by using the sintered alumina body which had been obtained under the same production conditions as in Example 1. As a sintered alumina body having a far-infrared radiation film on a surface thereof also exhibits similar or better heat radiation characteristics as the sintered alumina body, the sintered alumina body with the far-infrared radiation film formed on the surface thereof is believed to have similar heat dissipation effects or still better heat radiation effects.

Industrial Applicability

As an application example of the disclosed embodiments, the ceramic of the disclosed embodiments for the heat-radiating member has high thermal conductivity unavailable from conventional ceramics, can realize efficient heat dissipation performance, and moreover, is also excellent in mechanical strength and thermal shock resistance, and therefore, can solve the problem of heat generation during operation, which has become pronounced in electronic devices or equipment. Further, the ceramic of the disclosed embodiments for the heat-radiating member has an outstanding utility value, because it is allowed to function as a heat radiator when its sintered alumina body, its sintered alumina body having a far-infrared radiation film is simply and directly arranged in close contact with heat-generating portion or portions. In particular, the electronic devices or equipment in recent years have a pronounced tendency toward miniaturization, high integration and high functionalization, and further, the problem of global warming in recent years is serious. Accordingly, there is a strong demand for energy saving in appliances and electronic devices and equipment, and expectations on the ceramic according to the disclosed embodiments, which can obviate the arrangement of a cooling device such as a fan and can function as a heat radiator, are extremely high in various fields. The ceramic according to the disclosed embodiments is hence expected to find utility as a heat sink material not only in solar cell modules and LED light-emitting modules mentioned as application examples in the disclosed embodiments but also in devices and equipment requiring high heat dissipation such as electronic devices and equipment.

Legend

1 Sintered alumina body
2 Far-infrared radiation film
5 Temperature sensor
10 Heater
11 Measurement box
12 Support
13 Wooden base
14 Needle
15 Weight
16 Thermometer
17 Air speedometer
18 Power generation cell
25 Wiring

The invention claimed is:

1. A process for producing a ceramic for a heat-radiating member, comprising:
providing as raw materials, an alumina powder having an alumina ($Al_2O_3$) content of at least 99.5 mass % and an average particle size of from 0.2 to 1 μm, and a silica ($SiO_2$) content of at most 0.1 mass %;
granulating the powder into a form of granules ranging from 50 to 100 μm;
pressing the raw material which has been obtained during the granulating and which includes granular alumina so as to form a green compact;
heating the green compact in an air atmosphere at a firing temperature of from 1,480 to 1,600° C. so as to obtain a sintered alumina body; and
forming a coating of a far-red radiation coating composition on at least a part of a surface of the sintered alumina body obtained by the heating, and baking the coating so as to form a far-infrared radiation film, wherein the sintered alumina body has crystal grain sizes from 1 to 10 μm, contains crystal grains in a range from 30 to 55 and from 126 to 145 grains in an area of 30×20 μm, and has a thermal conductivity of at least 33 W/m·K.

2. The process according to claim 1, wherein the firing temperature is from 1,500 to 1,592° C.

3. The process according to claim 1, wherein the green compact is obtained with a density of at least 2.40 g/cm$^3$.

4. The process according to claim 1, further comprising quenching the green compact, after the heating, at a rate from 1.3 to 2.0 times a heating rate of the green compact during heating to the firing temperature, so as to obtain the sintered alumina body.

5. The process according to claim 1, wherein the heating is conducted in an air-circulating batch furnace.

6. The process according to claim 1, wherein the far-infrared radiation coating composition comprises a heat-resistant inorganic bonding agent and a calcined, fine powder mixture, which has been obtained by mixing at least two kinds of transition element oxides and calcining the resulting mixture at a temperature from 700 to 1,300° C., at a mass ratio from 97:3 to 20:80.

7. A ceramic for a heat-radiating member, comprising:
a sintered alumina body having an alumina ($Al_2O_3$) content of at least 99.5 mass % and
a silica ($SiO_2$) content of at most 0.1 mass %; and
a far-infrared radiation film formed on at least a part of a surface of the sintered alumina body,
wherein the sintered alumina body has crystal grain sizes from 1 to 10 μm, contains crystal grains in a range from 30 to 55 and from 126 to 145 grains in an area of 30×20 μm, and has a thermal conductivity of at least 33 W/m·K.

8. The ceramic according to claim 7, wherein the sintered alumina body has a density of at least 3.8 g/cm$^3$.

9. The ceramic according to claim 8, wherein the sintered alumina body has a density of at least 3.93 g/cm$^3$.

10. The ceramic according to claim 7, wherein in the sintered alumina body, the alumina ($Al_2O_3$) content is at least 99.8 mass %, and the silica ($SiO_2$) content is at most 0.05 mass %.

11. The ceramic according to claim 7, wherein the far-infrared radiation film comprises: a baked coating of a far-infrared radiation coating composition comprising a heat-resistant inorganic bonding agent and a calcined fine powder mixture, which has been obtained by mixing at least two transition element oxides and calcining the resulting mixture at a temperature from 700 to 1,300° C., at a mass ratio from 97:3 to 20:80.

12. The ceramic according to claim 11, wherein the at least two transition metal oxides are selected from the group consisting of $MnO_2$ in an amount from 10 to 80 mass %, $Fe_2O_3$ in an amount from 5 to 80 mass %, CoO in an amount from 5 to 50 mass %, CuO in an amount from 10 to 80 mass % and $Cr_2O_3$ in an amount from 2 to 30 mass %.

13. The ceramic according to claim 7, the sintered alumina body further comprising at least one material selected from the group consisting of magnesia in an amount from 0.07 to 0.15 mass %, $Na_2O$ in an amount from 0.03 to 0.05 mass %, and $Fe_2O_3$ in an amount from 0.01 to 0.02 mass %.

14. The ceramic according to claim 13, wherein the sintered alumina body comprises no other impurities.

15. The ceramic according to claim 7, wherein the sintered alumina body has no segregation of silica at interfaces of the crystal grains.

16. The ceramic according to claim 15, wherein the sintered alumina body has the thermal conductivity of at least 36 W/m·K.

17. The ceramic according to claim 7, wherein the sintered alumina body has a flexural strength from 400 to 520 MPa.

18. A solar cell module comprising power generation cells and a ceramic for a heat-radiating member arranged on back sides of the power generation cells,
wherein the ceramic comprises a sintered alumina body having an alumina ($Al_2O_3$) content of at least 99.5 mass % and a silica ($SiO_2$) content of at most 0.1 mass %, and
the sintered alumina body has crystal grain sizes from 1 to 10 μm, contains crystal grains in a range from 30 to 55 and from 126 to 145 grains in an area of 30×20 μm, and has a thermal conductivity of at least 33 W/m·K.

19. The solar cell according to claim 18, wherein the sintered alumina body has a density of at least 3.8 g/cm$^3$.

20. An LED light-emitting module comprising: a substrate; a circuit formed on a surface of the substrate; and LED devices arranged on the circuit,
wherein the substrate is a ceramic for a heat-radiating member,
the ceramic comprises a sintered alumina body having an alumina ($Al_2O_3$) content of at least 99.5 mass % and a silica ($SiO_2$) content of at most 0.1 mass %, and
the sintered alumina body has crystal grain sizes from 1 to 10 μm, contains crystal grains in a range from 30 to 55 and from 126 to 145 grains in an area of 30×20 μm, and has a thermal conductivity of at least 33 W/m·K.

21. The LED light-emitting module according to claim 20, wherein the sintered alumina body has a density of at least 3.8 g/cm$^3$.

* * * * *